(12) United States Patent
Aratani et al.

(10) Patent No.: US 8,536,611 B2
(45) Date of Patent: Sep. 17, 2013

(54) ORGANIC LIGHT-EMITTING ELEMENT, METHOD FOR MANUFACTURING THE ORGANIC LIGHT-EMITTING ELEMENT, APPARATUS FOR MANUFACTURING THE ORGANIC LIGHT-EMITTING ELEMENT, AND ORGANIC LIGHT-EMITTING DEVICE USING THE ORGANIC LIGHT-EMITTING ELEMENT

(75) Inventors: Sukekazu Aratani, Hitachiota (JP); Kazuhito Masuda, Hitachi (JP); Kotaro Araya, Hitachiota (JP); Hiroyuki Kagawa, Hitachinaka (JP); Shintaro Takeda, Hitachi (JP); Shingo Ishihara, Mito (JP)

(73) Assignee: Hitachi, Ltd., Tokyo (JP)

( * ) Notice: Subject to any disclaimer, the term of this patent is extended or adjusted under 35 U.S.C. 154(b) by 167 days.

(21) Appl. No.: 12/999,859

(22) PCT Filed: Jun. 15, 2009

(86) PCT No.: PCT/JP2009/060867
§ 371 (c)(1),
(2), (4) Date: Dec. 17, 2010

(87) PCT Pub. No.: WO2009/154168
PCT Pub. Date: Dec. 23, 2009

(65) Prior Publication Data
US 2011/0101401 A1    May 5, 2011

(30) Foreign Application Priority Data

Jun. 17, 2008  (JP) ................. 2008-157330
Jun. 25, 2008  (JP) ................. 2008-165213
Jul. 3, 2008   (JP) ................. 2008-174074

(51) Int. Cl.
*H01L 51/52* (2006.01)

(52) U.S. Cl.
USPC .............. 257/99; 257/79; 257/88; 257/91; 257/E51.019; 313/483; 313/498; 313/499; 313/500; 313/505; 438/29

(58) Field of Classification Search
USPC ........................................... 257/98
See application file for complete search history.

(56) References Cited

U.S. PATENT DOCUMENTS 4,872,925 A * 10/1989 McMaster ............... 136/244
5,142,331 A *  8/1992 Yoshida .................. 257/464
(Continued)

FOREIGN PATENT DOCUMENTS

EP   0 862156   9/1998
EP   1 555 855  7/2005
(Continued)

OTHER PUBLICATIONS

Meerheim et al., "Ultrastable and Efficient Red Organic Light Emitting Diodes With Doped Transports Layers," Applied Physics letters, 2006, pp. 061111-1-061111-3, vol. 89.

(Continued)

*Primary Examiner* — Cheung Lee
*Assistant Examiner* — William Harriston
(74) *Attorney, Agent, or Firm* — Antonelli, Terry, Stout & Kraus, LLP.

(57) ABSTRACT

An organic light-emitting display device is provided that has prolonged service life, lowered wiring resistance that can lower power consumption, and that is easy to manufacture. In a first embodiment, a moisture capturing layer is provided between an upper electrode and a lower electrode. A second embodiment includes a metal substrate, an organic light-emitting element on the substrate and an upper transparent electrode connected to the substrate through a contact hole. In a third embodiment, a method is provided for forming a first organic compound including a light-emitting layer, heating the first organic compound in vacuo, and forming a second organic compound.

7 Claims, 23 Drawing Sheets

(56) References Cited

U.S. PATENT DOCUMENTS

| | | | | |
|---|---|---|---|---|
| 5,362,672 | A * | 11/1994 | Ohmi et al. | 117/108 |
| 6,500,295 | B1 * | 12/2002 | Kubota | 156/269 |
| 6,894,734 | B1 * | 5/2005 | Ihara | 349/38 |
| 7,138,303 | B2 * | 11/2006 | Tanabe et al. | 438/149 |
| 7,291,973 | B2 * | 11/2007 | Ishihara et al. | 313/505 |
| 7,759,859 | B2 * | 7/2010 | Arai et al. | 313/504 |
| 7,887,385 | B2 * | 2/2011 | Ohmi et al. | 445/24 |
| 7,943,963 | B2 * | 5/2011 | Murakami et al. | 257/189 |
| 2001/0024083 | A1 * | 9/2001 | Yamazaki et al. | 313/483 |
| 2002/0025597 | A1 * | 2/2002 | Matsuda | 438/57 |
| 2003/0048072 | A1 * | 3/2003 | Ishihara et al. | 313/506 |
| 2003/0184221 | A1 | 10/2003 | Mishima | |
| 2003/0193287 | A1 | 10/2003 | Sakamoto et al. | |
| 2003/0198830 | A1 | 10/2003 | Kim et al. | |
| 2004/0018797 | A1 | 1/2004 | Murakami et al. | |
| 2004/0065877 | A1 | 4/2004 | Kazuhiko | |
| 2004/0108810 | A1 | 6/2004 | Tsujimura et al. | |
| 2005/0116623 | A1 * | 6/2005 | Kim et al. | 313/504 |
| 2005/0116630 | A1 * | 6/2005 | Kim et al. | 313/506 |
| 2005/0236981 | A1 * | 10/2005 | Cok et al. | 313/504 |
| 2006/0006540 | A1 * | 1/2006 | Park et al. | 257/758 |
| 2006/0012742 | A1 * | 1/2006 | Tsai et al. | 349/139 |
| 2006/0017378 | A1 | 1/2006 | Tsujimura et al. | |
| 2006/0027800 | A1 | 2/2006 | MacPherson et al. | |
| 2006/0125387 | A1 | 6/2006 | Masaya | |
| 2006/0186475 | A1 * | 8/2006 | Tanabe et al. | 257/347 |
| 2006/0192814 | A1 | 8/2006 | Morii et al. | |
| 2006/0202613 | A1 * | 9/2006 | Kawaguchi et al. | 313/506 |
| 2006/0210704 | A1 | 9/2006 | Kimura et al. | |
| 2006/0211325 | A1 | 9/2006 | Murakami et al. | |
| 2006/0267491 | A1 * | 11/2006 | Koo et al. | 313/511 |
| 2006/0292955 | A1 * | 12/2006 | Kang et al. | 445/24 |
| 2007/0099026 | A1 | 5/2007 | Yeob | |
| 2007/0200494 | A1 * | 8/2007 | Matsudate et al. | 313/506 |
| 2007/0222372 | A1 * | 9/2007 | Cok et al. | 313/504 |
| 2007/0241664 | A1 * | 10/2007 | Sakamoto et al. | 313/503 |
| 2007/0251457 | A1 | 11/2007 | Ohsawa et al. | |
| 2007/0257607 | A1 * | 11/2007 | Arai et al. | 313/505 |
| 2007/0259586 | A1 | 11/2007 | Sakamoto et al. | |
| 2007/0286944 | A1 * | 12/2007 | Yokoyama et al. | 427/66 |
| 2008/0007679 | A1 * | 1/2008 | Ochiai et al. | 349/114 |
| 2008/0084808 | A1 * | 4/2008 | Kumagai | 369/112.1 |
| 2008/0093988 | A1 | 4/2008 | Manabu | |
| 2008/0111935 | A1 * | 5/2008 | Lee et al. | 349/43 |
| 2008/0265759 | A1 * | 10/2008 | Young et al. | 313/504 |
| 2008/0290787 | A1 * | 11/2008 | Cok | 313/503 |
| 2008/0309233 | A1 * | 12/2008 | Hasegawa et al. | 313/505 |
| 2009/0026943 | A1 * | 1/2009 | Yuki | 313/504 |
| 2009/0146557 | A1 * | 6/2009 | Shinto et al. | 313/504 |
| 2009/0179573 | A1 * | 7/2009 | Kang et al. | 315/169.3 |
| 2009/0189163 | A1 * | 7/2009 | Wang et al. | 257/72 |
| 2009/0251653 | A1 * | 10/2009 | Hayashi | 349/139 |
| 2010/0072884 | A1 * | 3/2010 | Tchakarov et al. | 313/504 |
| 2010/0164842 | A1 * | 7/2010 | Ishihara et al. | 345/32 |
| 2010/0188593 | A1 * | 7/2010 | Yamaguchi et al. | 349/43 |
| 2010/0208155 | A1 * | 8/2010 | Gao | 349/43 |
| 2010/0213456 | A1 * | 8/2010 | Matsudate et al. | 257/40 |
| 2010/0231490 | A1 * | 9/2010 | Okano | 345/80 |
| 2010/0252841 | A1 * | 10/2010 | Cok et al. | 257/89 |
| 2010/0277662 | A1 * | 11/2010 | Fan Jiang et al. | 349/43 |
| 2010/0295819 | A1 * | 11/2010 | Ozeki et al. | 345/174 |
| 2011/0155296 | A1 * | 6/2011 | Nakamura et al. | 156/67 |
| 2011/0198641 | A1 * | 8/2011 | Yahata et al. | 257/98 |
| 2011/0285269 | A1 * | 11/2011 | Adachi et al. | 313/113 |
| 2012/0074414 | A1 * | 3/2012 | Lee et al. | 257/59 |

FOREIGN PATENT DOCUMENTS

| | | |
|---|---|---|
| EP | 1 585 371 | 10/2005 |
| EP | 1 684550 | 7/2006 |
| JP | 11-329734 | 11/1999 |
| JP | 2001-297876 | 10/2001 |
| JP | 2001-345185 | 12/2001 |
| JP | 2001345185 | 12/2001 |
| JP | 2002-299060 | 10/2002 |
| JP | 2003308968 | 10/2003 |
| JP | 2004-070351 | 3/2004 |
| JP | 2004-071558 | 3/2004 |
| JP | 2004-119210 | 4/2004 |
| JP | 2004-185967 | 7/2004 |
| JP | 2005-38651 | 2/2005 |
| JP | 2005-183168 | 7/2005 |
| JP | 2005-276756 | 10/2005 |
| JP | 2006164808 | 6/2006 |
| JP | 2006-239479 | 9/2006 |
| JP | 2007-100083 | 4/2007 |
| JP | 2007-173519 | 7/2007 |
| JP | 2007-180376 | 7/2007 |
| JP | 2007-314877 | 12/2007 |
| JP | 2008-037755 | 2/2008 |
| JP | 2008-63327 | 3/2008 |
| JP | 2008-509528 | 3/2008 |
| JP | 2008-109103 | 5/2008 |
| JP | 2009-525606 | 7/2009 |
| WO | WO98/12689 A1 | 3/1998 |
| WO | WO2006/057177 A1 | 6/2006 |
| WO | WO 2006/130883 | 12/2006 |
| WO | WO 2007/088383 | 8/2007 |

OTHER PUBLICATIONS

Akino et al., "Development of New Materials in Polymer Light Emitting Diodes," IDW, 2006, ppp. 441-444.

Sonoyama et al., "Ink Jet Printable Phosphorescent Organic Light-Emitting Devices," IDW, 2007, pp. 241-244.

Office Action in JP 2008-157330, dated Jun. 22, 2012 (3 pgs., in Japanese); [English language translation, 2 pgs.].

Office Action in JP 2008-174074, dated Jun. 22, 2012 (3 pgs, in Japanese); [English language translation, 4 pgs.].

Office Action in JP 2008-165213, dated Jun. 22, 2012 (3 pgs, in Japanese); [English Language translation, 4 pgs.].

Office Action in JP 2008-174074, dated Sep. 21, 2012 (2 pgs, in Japanese), [English language translation, 2 pgs.].

Office Action in JP 2008-165213, mailed Mar. 19, 2013, (in Japanese, 2 pgs.), English language translation, 3 pages).

European Search Report and Extended ESR in EP13165923, dated Jul. 13, 2013 (11 pgs.).

* cited by examiner

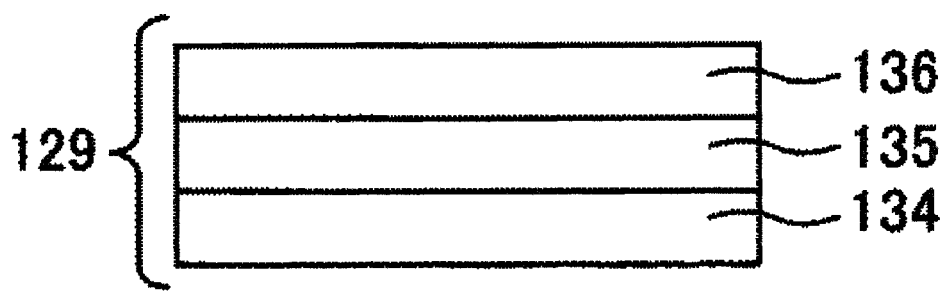
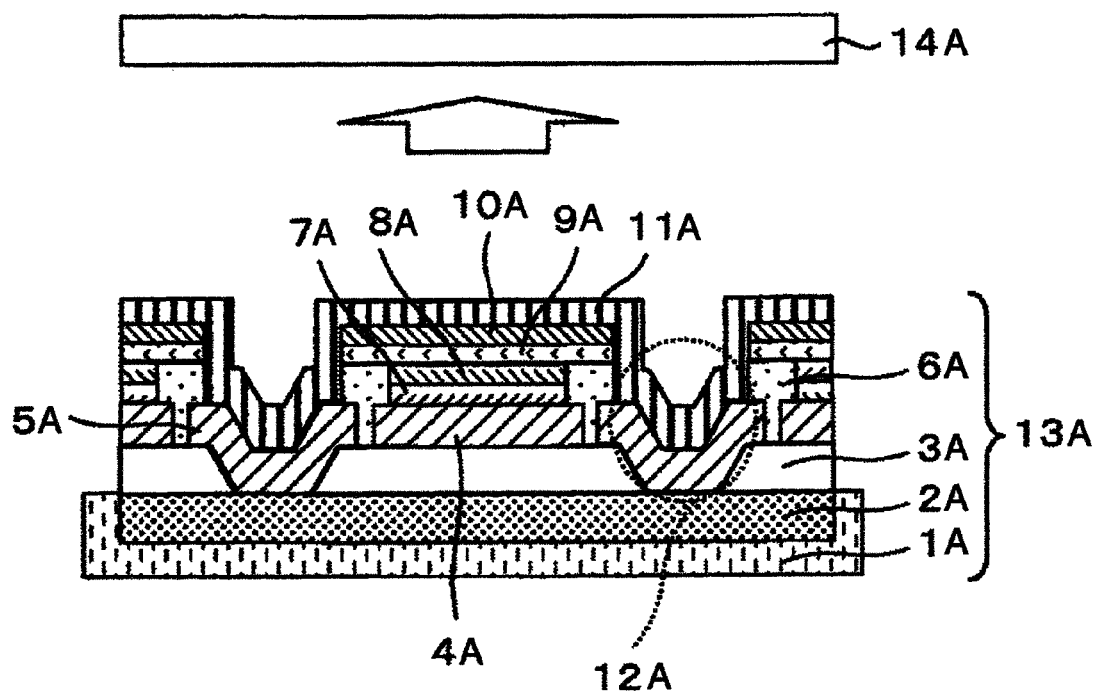

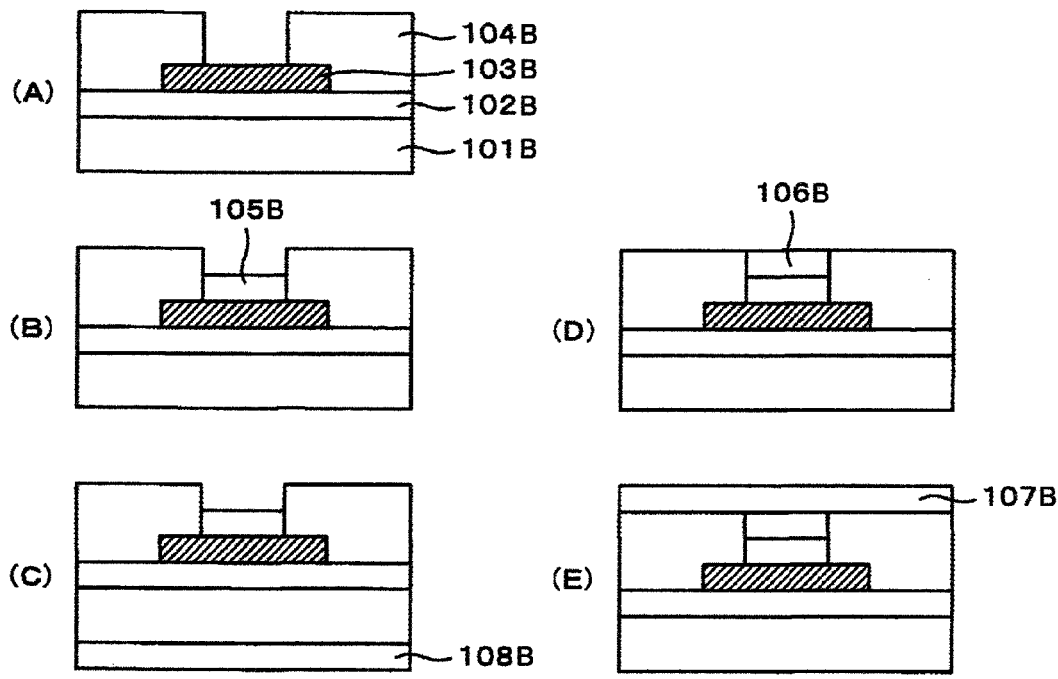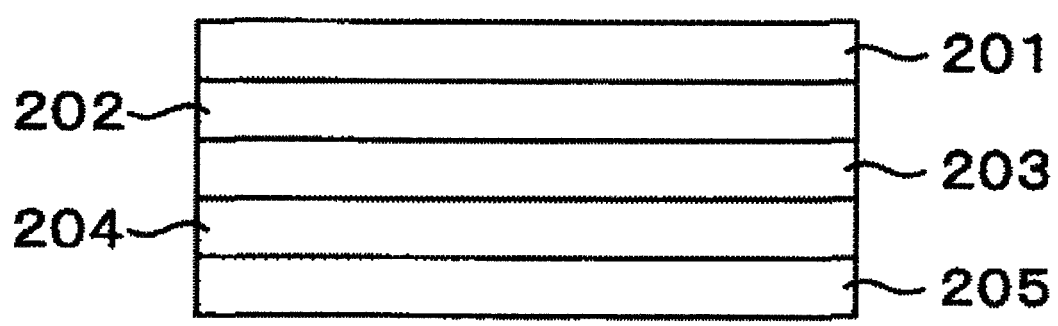

ORGANIC LIGHT-EMITTING ELEMENT, METHOD FOR MANUFACTURING THE ORGANIC LIGHT-EMITTING ELEMENT, APPARATUS FOR MANUFACTURING THE ORGANIC LIGHT-EMITTING ELEMENT, AND ORGANIC LIGHT-EMITTING DEVICE USING THE ORGANIC LIGHT-EMITTING ELEMENT

FIELD OF THE INVENTION

The present invention relates to an organic light-emitting element, a method for manufacturing the organic light-emitting element, an apparatus for manufacturing the organic light-emitting element, and an organic light-emitting device using the organic light-emitting element.

BACKGROUND OF THE INVENTION

Recently, organic light-emitting display devices have been attracting attention as plane type display devices of the next generation. They have excellent characteristics of natural light, wide view angles, fast response and so on.

Generally, an organic light-emitting element has a structure with a glass substrate which supports an organic light electroluminescent (EL) layer composed of a transparent electrode, e.g., of ITO, hole transporting layer, light-emitting layer, electron transporting layer and so on, and reflective electrode of low work function, where light emitted from the light-emitting layer is emitted from the back side of the substrate after passing through the electrode.

These organic light-emitting display devices can now have high efficiency and prolonged service life, when each of the organic layers is formed by vacuum deposition. R. Meerheim et al, for example, discloses that vacuum deposition can manufacture an organic red-color-emitting element having a brightness half period of 1,500,000 hours or more, when its initial brightness is 500 cd/m$^2$ (Non-patent Document 1). The other methods for manufacturing organic light-emitting display devices include wet processes, e.g., spin coating and ink jetting for forming organic layers. An organic light-emitting display device manufactured by a wet process has a shorter service life and lower efficiency than an organic light-emitting element manufactured by vacuum deposition. Non-patent Document 2 discloses that an organic red-color-emitting element manufactured by spin coating using polymers has a service life of about 100,000 hours when its initial brightness is 500 cd/m$^2$. The service life is about one-tenth that disclosed in Non-patent Document 1.

Recently, use of low-molecular-weight materials for forming films by embrocation has been studied. For example, Non-patent Document 3 discloses that an organic red-color-emitting element has a service life of at least 25,000 hours when its initial brightness is 500 cd/m$^2$. The element has a shorter service life than the one manufactured by vacuum deposition using a low-molecular-weight material, disclosed in Patent Document 1. As discussed above, an element with a light-emitting layer manufactured by a wet process has a shorter service life than the one manufactured by vacuum deposition.

Organic light-emitting devices have been expected to find use for thin-film illuminators, thin-film display devices, illuminators for liquid-crystalline display devices. The light-emitting device is provided with a plurality of organic light-emitting elements forming pixels on a substrate. An organic light-emitting element has a structure with a plurality of organic layers disposed between upper and lower electrodes. The organic layers include hole transporting layer, electron transporting layer and light-emitting layer in which holes are recombined with electrons. When a voltage is applied between the electrodes, holes and electrons injected from the electrodes are recombined with each other in the light-emitting layer to emit light.

For example, Patent Document 2 discloses an organic light-emitting element having a stripe-shape lower electrode transmitting emitted light and upper electrode serving as a common electrode, wherein one of the electrodes is transparent. Power is supplied to each side of the lower electrode to diminish uneven brightness. The lower electrode, when transparent, has a high resistivity and suffers voltage loss around the center of the organic light-emitting device by wiring resistance, because of its high resistivity, to increase power consumption, even when power is supplied to each side. These troubles also occur with a transparent upper electrode.

Ink jetting is one of the processes for manufacturing organic layers for light-emitting display devices. For example, Patent Document 3 discloses a process comprising steps for forming a layer containing a first organic compound by embrocation, for heating the layer under a vacuum immediately before forming a layer, e.g., light-emitting layer, containing a second organic compound, and for forming the layer containing a second organic compound by vacuum deposition.

PRIOR ART DOCUMENTS

Patent Documents
Patent Document 1: JP-A-2004-185967
Patent Document 2: JP-A-2007-173519
Patent Document 3: JP-A-2004-71558
Non-Patent Documents
Non-patent Document 1: Appl. Phys. Lett., 89, 061111 (2006)
Non-patent Document 2: IDW'06, p. 441 (2006)
Non-patent Document 3: IDW'07, p. 241 (2007)

SUMMARY OF THE INVENTION

Problems to be Solved by the Invention

It is an object of the first embodiment of the present invention is to provide an organic light-emitting display device having a prolonged service life, wherein its light-emitting layer can be conveniently manufactured by a wet process It is an object of the second embodiment of the present invention is to provide an organic light-emitting device capable of reducing power consumption by reducing wiring resistance in the upper electrode (transparent electrode) which transmits light emitted from its light-emitting layer.

The third embodiment of the present invention manufactures and investigates a prototype element, wherein a light-emitting layer is formed by embrocation and layers to be stacked thereon are formed by vacuum deposition.

The embodiment manufactures two types of elements with a hole injection layer, hole transporting layer, light-emitting layer and electron transporting layer disposed between upper and lower electrodes. One type (Element A) has the hole injection, hole transporting and light-emitting layers formed by embrocation, and the electron transporting layer formed by vacuum deposition. The other type (Element B) has the hole injection and hole transporting layers formed by embrocation, and the light-emitting and electron transporting layers formed by vacuum deposition.

Element A has the light-emitting layer formed by embrocation whereas Element B has the light-emitting layer formed by vacuum deposition. Element A has a notably shorter service life than Element B.

The embodiment also manufactures another type of element (Element C) with the light-emitting layer formed by vacuum deposition, as with Element B, and electron layer formed by vacuum deposition after the light-emitting layer is exposed, for several minutes, to an embrocation atmosphere having a dew point of 90° C., which corresponds to a moisture content of about 100 ppb. Element C has a service life notably lower than that of Element B and on a level with that of Element A.

The vacuum deposition chamber for vacuum deposition is kept at $1 \times 10^{-4}$ Pa or less. It is estimated that the atmosphere in the chamber contains moisture at about 10 ppb, on the assumption that the atmosphere substantially consists of moisture. The moisture content in the atmosphere for embrocation (about 100 ppb) is much higher than the moisture content (about 10 ppb) in the atmosphere in the vacuum deposition chamber. It is considered that the notably deteriorated service life of Element C results from moisture adsorbed by the light-emitting layer formed by vacuum deposition.

Based on the observed life-related characteristics of Elements A, B and C, the low service life of Element A with the light-emitting layer formed by embrocation results from moisture adsorbed by the light-emitting layer. These results indicate that removal of moisture adsorbed on the organic light-emitting layer, formed by embrocation, is an effective means for improving service life of the organic light-emitting element.

Objects of the present invention are to provide a process for manufacturing an organic light-emitting element of prolonged service life, and also to provide an apparatus for manufacturing the element.

Means for Solving the Problem

The organic light-emitting display device of the first embodiment of the present invention is an organic light-emitting display device comprising:
a light-emitting layer;
an upper electrode and a lower electrode sandwiching the light-emitting layer, wherein one of the electrodes is a transparent electrode transmitting a light emitted from the light-emitting layer and the other electrode is a reflective electrode which reflects a light emitted from the light-emitting layer; and
a moisture capturing layer disposed between the upper electrode and the lower electrode.

The organic light-emitting device of one embodiment of the second embodiment of the present invention is an organic light-emitting device comprising a light-emitting element disposed on an electroconductive substrate, the light-emitting element comprising a lower reflective electrode, an organic layer and an upper transparent electrode, wherein the upper transparent electrode is connected to the electroconductive substrate via a contact hole disposed around the lower reflective electrode.

The organic light-emitting device of another embodiment of the present invention is an organic light-emitting device comprising a light-emitting element disposed on an electroconnductive substrate, the light-emitting element comprising an organic layer and an upper transparent electrode, wherein the electroconductive substrate serves as a reflective electrode capable of reflecting emitted light.

The third embodiment of the present invention relates to a method for manufacturing an organic light-emitting element having:
a substrate;
a first electrode and a second electrode formed on the substrate; and
a first organic compound including a light-emitting layer and a second organic compound sandwiched between the first electrode and the second electrode, comprising the steps of:
forming the first organic compound;
heating the first organic compound under a vacuum; and
forming the second organic compound,
wherein the step of heating the first organic compound under a vacuum is carried out between the step of forming the first organic compound and the step of forming the second organic compound.

The present invention also relates to an apparatus for manufacturing an organic light-emitting element having:
a substrate;
a first electrode and a second electrode formed on the substrate; and
a first organic compound including a light-emitting layer and a second organic compound sandwiched between the first electrode and the second electrode, which apparatus comprises:
an embrocation chamber for forming the first organic compound;
a vacuum heat chamber for heating the first organic compound under a vacuum;
a vacuum deposition chamber for forming the second organic compound;
a chamber for forming the first electrode by a resistance heating method or a sputtering method; and
a transfer chamber for transferring the substrate from the embrocation chamber to the vacuum heat chamber, from the vacuum heat chamber to the vacuum deposition chamber, and from the vacuum deposition chamber to the chamber for forming the first electrode.

Another embodiment of the apparatus of the present invention is an apparatus for manufacturing an organic light-emitting element having a first organic compound including a light-emitting layer and a second organic compound sandwiched between a first electrode and a second electrode, which apparatus comprises:
an embrocation chamber for forming the first organic compound;
a vacuum deposition chamber for forming the second organic compound;
a chamber for forming the first electrode by a resistance heating method or a sputtering method; and
a transfer chamber for transferring a substrate from the embrocation chamber to the vacuum deposition chamber, and from the vacuum deposition chamber to the chamber for forming the first electrode,
wherein a high-frequency dielectric device or a microwave generator is disposed in the transfer chamber.

Still another embodiment of the apparatus of the present invention is an apparatus for manufacturing an organic light-emitting element having:
a substrate;
a first electrode and a second electrode formed on the substrate; and
a first organic compound including a light-emitting layer and a second organic compound sandwiched between the first electrode and the second electrode, which apparatus comprises;

an embrocation chamber for forming the first organic compound;

a vacuum deposition chamber for forming the second organic compound;

a chamber for forming the first electrode by a resistance heating method or a sputtering method; and a transfer chamber for transferring the substrate from the embrocation chamber to the vacuum deposition chamber, and from the vacuum deposition chamber to the chamber for forming the first electrode, wherein a high-frequency dielectric device or a microwave generator is disposed in the vacuum deposition chamber.

Advantages of the Invention

The first embodiment of the present invention is an organic light-emitting display device which can be conveniently manufactured to have a structure for suppressing moisture-caused deterioration of light-emitting layer.

The second embodiment of the present invention is an organic light-emitting device capable of reducing power consumption by reducing wiring resistance in an upper transparent electrode.

The third embodiment of the present invention provides a method for manufacturing an organic light-emitting element having a prolonged service life and apparatus for manufacturing the element.

BRIEF DESCRIPTION OF THE DRAWINGS

FIG. 13 is a cross-sectional view illustrating an organic EL layer in the device illustrated in FIG. 12.

FIG. 1A is a cross-sectional view illustrating an organic light-emitting device of the second embodiment of the present invention, manufactured in Example 1A.

FIG. 1B (A), (B), (C), (D) and (E) illustrate process steps of the third embodiment of the present invention for manufacturing an organic light-emitting element.

FIG. 2B is a cross-sectional view illustrating the organic light-emitting element manufactured by the third embodiment of the present invention, emitting light from a second electrode.

Figure 1:
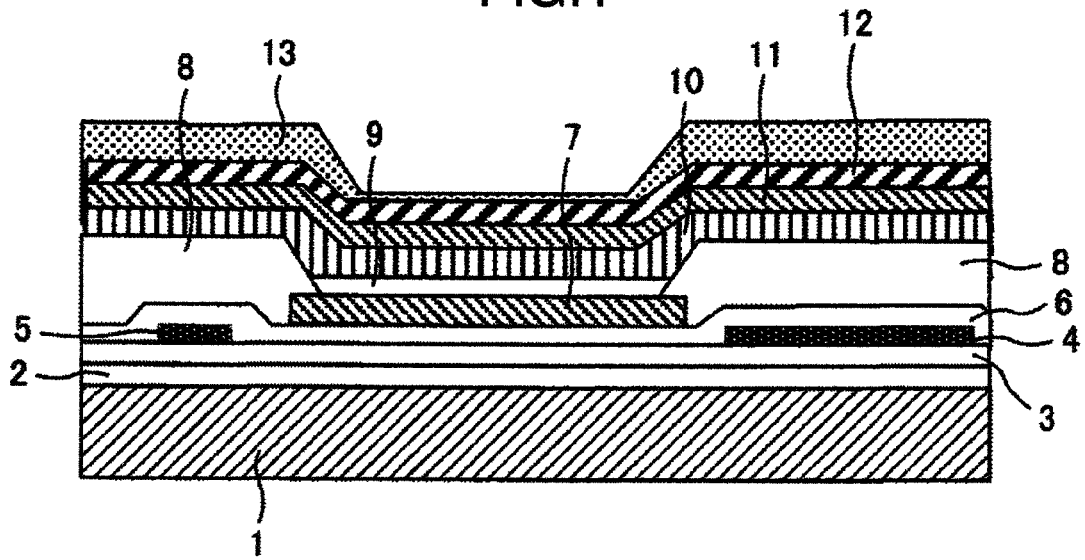
FIG. 1 is a cross-sectional view illustrating a red-color pixel in an organic light-emitting display device of the first embodiment of the present invention, manufactured in one Example.

DESCRIPTION OF REFERENCE NUMERALS 1, 21, 41, 61, 81, 101, 121: Glass substrate
2, 22, 42, 62, 82, 102, 122: First interlayer insulating film
3, 23, 43, 63, 83, 103, 123: Second interlayer insulating film
4, 24, 44, 64, 84, 104, 124: Power line
5, 25, 45, 65, 85, 105, 125: Image signal line
6, 26, 46, 66, 86, 106, 126: Third interlayer insulating film
7, 27, 47, 67, 87, 107: Transparent electrode (lower electrode)
8, 28, 48, 68, 88, 128: Bank
9, 29, 49, 69, 91, 129: Organic EL layer
10, 30, 51, 71, 111, 130: Blocking layer
11, 50, 70, 90, 112, 132: Moisture capturing layer
12, 32, 52, 72, 92, 113, 132: Electron transporting layer
13, 33, 53, 73, 93, 114: Upper electrode
14, 34, 54, 74, 89, 108, 134: Hole injection layer
15, 35, 55, 75, 94, 109, 135: Hole transporting layer
16, 36, 56, 76, 95, 110, 136: Light-emitting layer
127: Reflective electrode (lower electrode)
133: Transparent electrode (upper electrode)
1A: Insulating film
2A: Metallic substrate
3A: First interlayer insulating film
4A: Lower reflective electrode
5A: Connecting electrode
6A: Second interlayer insulating film
7A: Hole transporting layer
8A: White-color-emitting layer
9A: Electron transporting layer
10A: Electron injection layer
11A: Upper transparent electrode
12A, 20A, 40A, 50A, 70A: Contact hole
13A: OLED substrate
14A: Sealing substrate
21A, 32A, 41A, 51A, 71A: Auxiliary interconnector
31A: Composite substrate
42A: Third interlayer insulating film
101B, 702, 802, 1002: Substrate
102B: TFT-containing layer
103B, 205, 305, 405: Second electrode
104B: Diaphragm (Barrier rib)
105B: First organic compound
106B: Second organic compound
107B, 201, 301, 401: First electrode
108B: Heating apparatus (Heat generator)
202, 302, 404: Electron transporting layer
203, 303, 403: Light-emitting layer
204, 304, 402: Hole transporting layer
406: Hole injection layer
501, 601, 901: Embrocation chamber (Application chamber)
502, 602, 701, 701A, 701B: Vacuum chamber for heating (Vacuum heat chamber)
503, 603, 902, 1001, 1001A, 1001B: Vacuum deposition chamber
504, 604, 903: Chamber for forming first electrode
505, 605, 904: Sealing chamber
606, 801, 801A, 801B: Transfer chamber
703, 803, 1003: High-frequency dielectric device

EMBODIMENTS FOR CARRYING OUT THE INVENTION

Examples (Examples 1 to 7) for manufacturing the organic light-emitting display devices of the first embodiment of the present invention are described below by referring to FIGS. 1 to 13.

Examples (Examples 1A to 7A) for manufacturing the organic light-emitting devices of the second embodiment of the present invention are described below by referring to FIGS. 1A to 18A.

Examples (Examples 1B to 7B) describe the third embodiment of the present invention below in detail by referring to FIGS. 1B to 10B. It should be understood that the present invention is not limited by these examples.

EXAMPLES

Example 1

Figure 2:
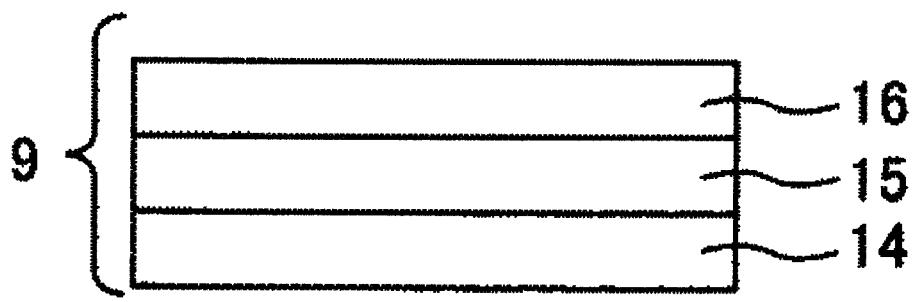
FIG. 2 is a cross-sectional view illustrating an organic EL layer in the device illustrated in FIG. 1.

FIG. 1 presents a cross-sectional view illustrating a red-color pixel structure in a bottom emission type organic light-emitting display device, in which light emitted from a light-emitting layer is emitted from a lower electrode. Referring to FIG. 1, a glass substrate 1 supports a first interlayer insulating film 2, second interlayer insulating film 3, power line 4, image signal line 5, third interlayer insulating film 6, transparent electrode 7 (lower electrode), bank 8, organic EL layer 9, blocking layer 10, moisture capturing layer 11, electron transporting layer 12 and upper electrode 13 (reflective electrode), in this order from the substrate 1. FIG. 2 presents a cross-sectional view illustrating the organic EL layer 9 disposed around the center of the pixel. It is composed of a hole injection layer 14, hole transporting layer 15 and light-emitting layer 16, in this order from the bottom.

The moisture capturing layer 11 is disposed between the transparent electrode 7 (lower electrode) and reflective electrode 13 (upper electrode).

The lower electrode 7 is a transparent electrode capable of transmitting light emitted from the light-emitting layer 16. The lower electrode 7 is made of ITO, and may be pattered by photolithography. Any material may be used for the lower electrode 7, so long as it has transparency and high work function, e.g., IZO and other electroconductive oxides in addition to ITO, and metals of high work function (e.g., thin Ag).

The bank 8 works to separate the adjacent pixels from each other. The bank 8 is made of an acryl-base resist, and the pattern is formed by photolithography. The bank 8 is surface-treated with $CF_4$ plasma to be water-repellent, after the bank 8 becomes insolubilized under heating. The bank 8 may be made of other high-molecular-weight materials, e.g., polyimide, phenol, novolac and epoxy resins.

The hole injection layer 14 injects holes transferred from the lower electrode 7. The hole injection layer 14 is made of poly(3,4-ethylene dioxythiophene) (PEDOT): polystyrene sulfonate (PSS). Other materials useful for the hole injection layer 14 include polypyrrole-base and tirphenylamine-base polymers in addition to PEDOT:PSS. Moreover, they may be combined with a low-molecular-weight compound, and phthalocyanine-base and starburstamine-base compounds may be also used.

The hole transporting layer 15 is a layer for transporting (transferring) a hole. The hole transporting layer 15 is made of an arylamine-base polymer. Other polymers useful for the hole transporting layer 15 include polyfluorene-base, polyparaphenylene-base, polyarylene-base and polycarbazole-base ones.

The light-emitting layer 16 provides the space in which injected holes and electrons are recombined with each other to emit light of wavelength determined by the layer constituent. The light-emitting layer 16 contains a host material doped with a light-emitting dopant. Example 1 uses 4,4'-di(N-carbazolyl)biphenyl (CBP), represented by the following Formula (h1) as the host material and an Ir complex, represented by the following Formula [d1], as the dopant material, where host/dopant ratio is set at 10/1 by mass. The light-emitting layer 16 is formed by a wet process, wherein a coating solution manufactured by dissolving the host material and dopant in a solvent is spread to form the layer. The applicable wet processes include ink jetting, printing and spraying, and ink jetting is used in Example 1 with the solution containing solids at 0.5% by mass. The solution for ink jetting preferably has a viscosity of from 1 to 20 mPa·s at room temperature. The solid concentration in the solution is not limited, so long as the solution gives a desired layer thickness. Example 1 uses a mixed polar solvent of aromatic-base, alcohol-base solvents or the like. These solvents may be used individually.

[Formula 1]

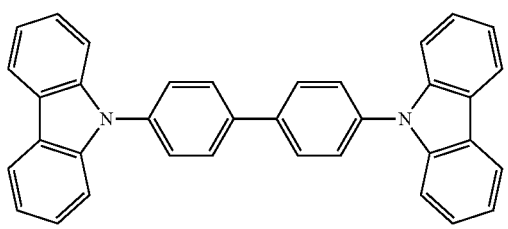

[h1]

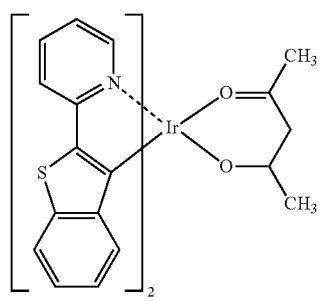

[d1]

These materials for the host material and dopant are not limited to the above. For example, the useful host materials include carbazole derivative, e.g., 4,4',4"-tri(N-carbazolyl)triphenylamine (TCTA) and N,N'-dicarbazolyl-3,5-benzene (mCP); quinolinol complex, e.g., aluminum(III)bis(2-methyl-8-quinolinate)-4-(phenylphenolate) (Balq); and iridium complex. They may be used in combination. The host material may be incorporated with a high-molecular-weight material, e.g., polycarbonate, working as a binder. Moreover, they may be incorporated with a hole transporting material, e.g., a triphenylamine derivative, or electron transporting material, e.g., an oxadiazole derivative or triazole derivative. The other materials useful for the light-emitting dopant include phosphorescent materials, e.g., other Ir complex, and Pt and Os complexes. Fluorescent materials, e.g., distyrylamine derivative, coumarin derivative and quinacridone derivative, are also useful.

The blocking layer 10 blocks movements of the exciters formed in the light-emitting layer 16 and holes injected into the light-emitting layer 16 toward the electron transporting layer 12. Example 1 uses aluminum(III)bis(2-methyl-8-quinolinate)-4-(phenylphenolate) (Balq) for the blocking layer 10. The material useful for the blocking layer 10 is not limited to Balq. Examples of the other useful materials include another quinolinol derivative, oxazole derivativs, triazole complex and polynuclear hydrocarbon.

The moisture capturing layer 11, which is one of the major features of the present invention, captures moisture present in the thin film in the element. Example 1 uses barium oxide for the moisture capturing layer 11. The material useful for the moisture capturing layer 11 is not limited to barium oxide. Examples of the other useful materials include oxides, e.g., lithium oxide, calcium oxide, strontium oxide, aluminum oxide and diphosphate pentaoxide; metals, e.g., Li, Ba, Ca and Cs; metallic carbonates, e.g., calcium carbide; and Schiff base, e.g., that represented by the following Formula [w1]. They may be used either individually or in combination.

[Formula 2]

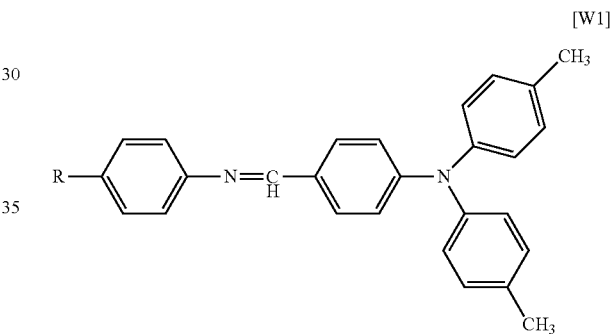

[W1]

R: —H, —CH$_3$ or the like

The electron transporting layer 12 transports (transfers) electrons. Example 1 uses tris(8-quinolinolate) aluminum (Alq$_3$) for the layer 12. The material useful for the layer 12 is not limited to Alq$_3$. Examples of the other useful materials include another quinolinol derivative, and oxadiazole derivative, triazole derivative, fllerene derivative, phenanthroline derivative and quinoline derivative.

The upper electrode 13 is a reflective electrode which is capable of reflecting light emitted from the light-emitting layer 16. Example 1 uses a laminate of LiF and Al for the upper electrode 13. The materials useful for the upper electrode 13 are not limited to them. Examples of the other useful materials include Cs, Ba and Ca compounds, e.g. other than LiF, and an electron transporting material co-deposited with an alkaline metal (e.g., Li or Cs), alkaline-earth metal or an electron donating organic material.

Figure 3:
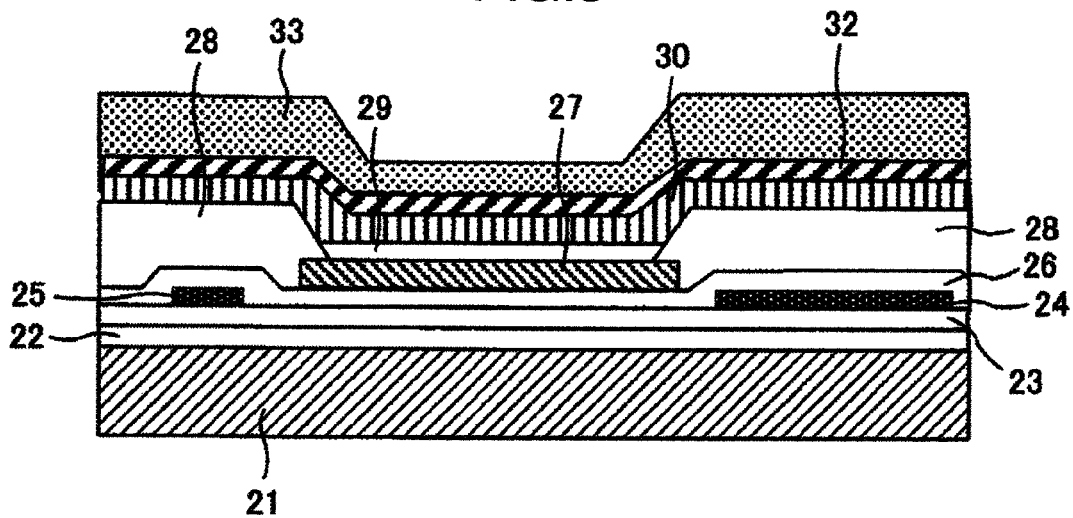
FIG. 3 is a cross-sectional view illustrating a red-color pixel in an organic light-emitting display device of the first embodiment of the present invention, manufactured in another Example.
Figure 4:
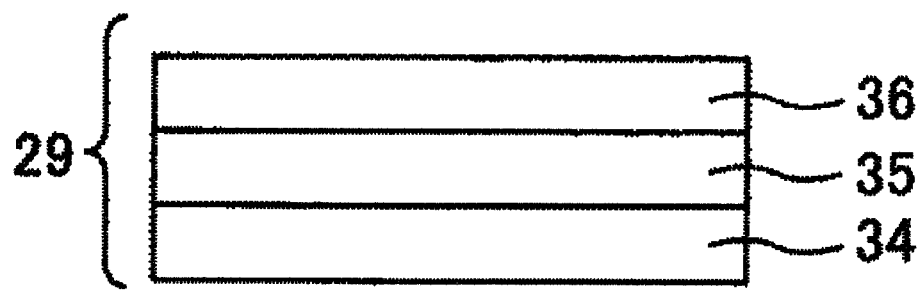
FIG. 4 is a cross-sectional view illustrating an organic EL layer in the device illustrated in FIG. 3.

FIG. 3 presents a cross-sectional view illustrating a red-color pixel manufactured in Comparative Example 1, and FIG. 4 presents a cross-sectional view illustrating the organic EL layer 29 in the pixel illustrated in FIG. 3. The pixel illustrated in FIG. 3 (Comparative Example 1) differs from that illustrated in FIG. 1 in that it has no moisture capturing layer 1 (cf. FIG. 1).

The pixel manufactured in Example 1 has a 1.2 times higher brightness half period than that manufactured in Comparative Example 1. The organic light-emitting display device manufactured in Example 1 has a reduced amount of moisture present in the light-emitting layer 16 to suppress moisture-caused deterioration, and can prolong service life of the device.

The device manufactured in Example 1 has the blocking layer 10 and electron transporting layer 12 of the common material in each pixel. The present invention is not limited to such a structure. However, the blocking layer 10 and the electron transporting layer 12 may be of different materials pixel by pixel.

Example 2

Figure 5:
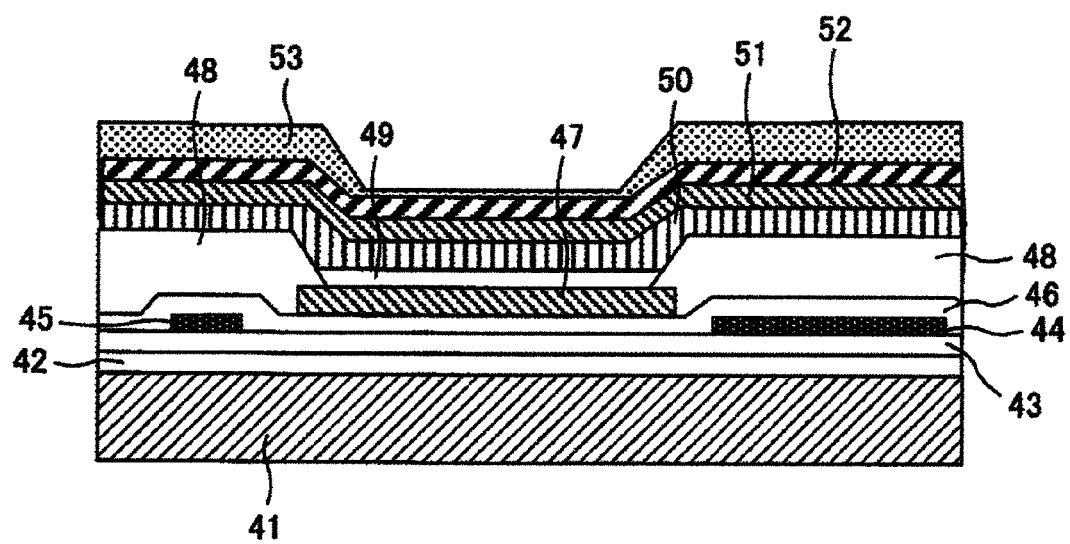
FIG. 5 is a cross-sectional view illustrating a red-color pixel in an organic light-emitting display device of the first embodiment of the present invention, manufactured in still another Example.
Figure 6:
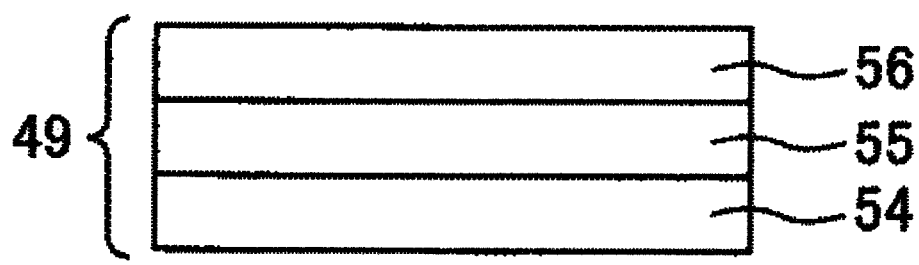
FIG. 6 is a cross-sectional view illustrating an organic EL layer in the device illustrated in FIG. 5.

FIG. 5 presents a cross-sectional view illustrating a red-color pixel manufactured in Example 2, and FIG. 6 presents a cross-sectional view illustrating an organic EL layer 49 in the pixel illustrated in FIG. 5. The pixel illustrated in FIG. 5 differs from that illustrated in FIG. 1 in that it has a moisture capturing layer 50 disposed between a light-emitting layer 56 and blocking layer 51 and that the light-emitting layer 56 has a so-called graded structure with a dopant dispersed at a lower concentration in the vicinity of the blocking layer 51 than in the vicinity of a hole transporting layer 55.

The pixel manufactured in Example 2 has a 1.2 times higher brightness half period than that manufactured in Comparative Example 1.

Example 3

Figure 7:
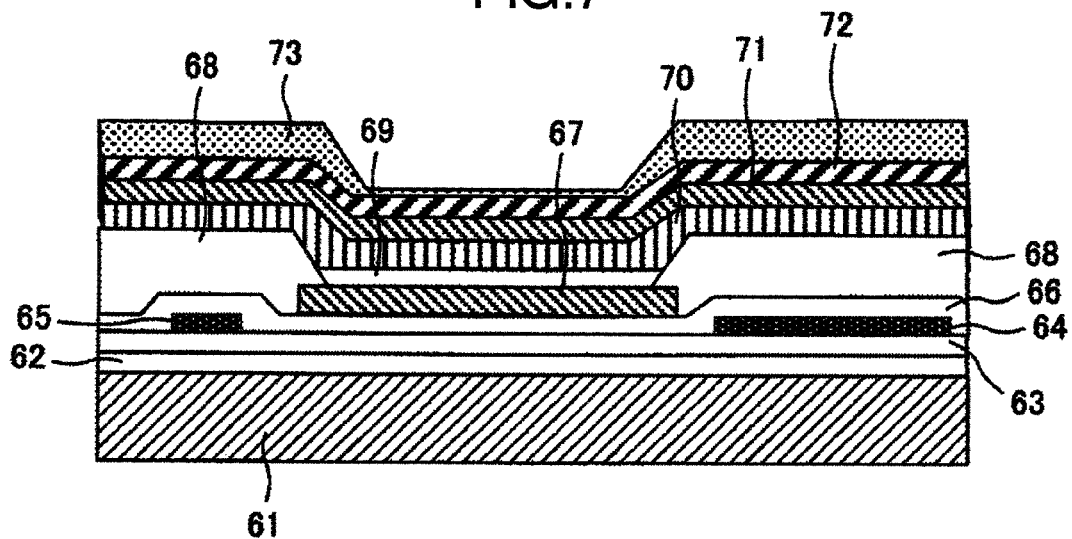
FIG. 7 is a cross-sectional view illustrating a red-color pixel in an organic light-emitting display device of the first embodiment of the present invention, manufactured in still another Example.
Figure 8:
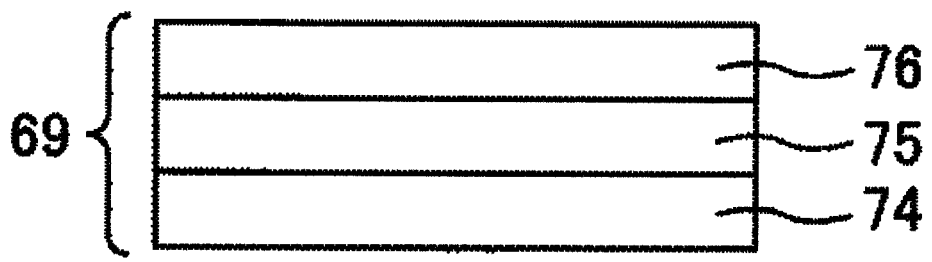
FIG. 8 is a cross-sectional view illustrating an organic EL layer in the device illustrated in FIG. 7.

FIG. 7 presents a cross-sectional view illustrating a red-color pixel manufactured in Example 3, and FIG. 8 presents a cross-sectional view illustrating an organic EL layer 69 in the pixel illustrated in FIG. 7. The pixel illustrated in FIG. 7 differs from that illustrated in FIG. 5 in that its light-emitting layer 76 contains Balq as a host material in place of CBP. CBP has a hole mobility and electron mobility on a level with each other, and can transfer both of these carriers. On the other hand, Balq is a so-called electron transporting material having an electron mobility higher than hole mobility. As a result, recombination of the electrons and holes occurs in the vicinity of a hole transporting layer 75 in the light-emitting layer 76.

The pixel manufactured in Example 3 has a 1.5 times higher brightness half period than that manufactured in Comparative Example 1.

Example 4

The pixel manufactured in Example 4 is the same as that manufactured in Example 1, illustrated in FIG. 1, except that its light-emitting layer 16 contains polycarbonate [Formula 3]. The pixel manufactured in Example 4 has a 1.3 times higher brightness half period than that manufactured in Comparative Example 1.

[Formula 3]

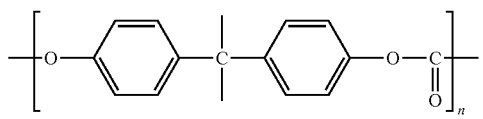

[b1]

Example 5

Figure 9:
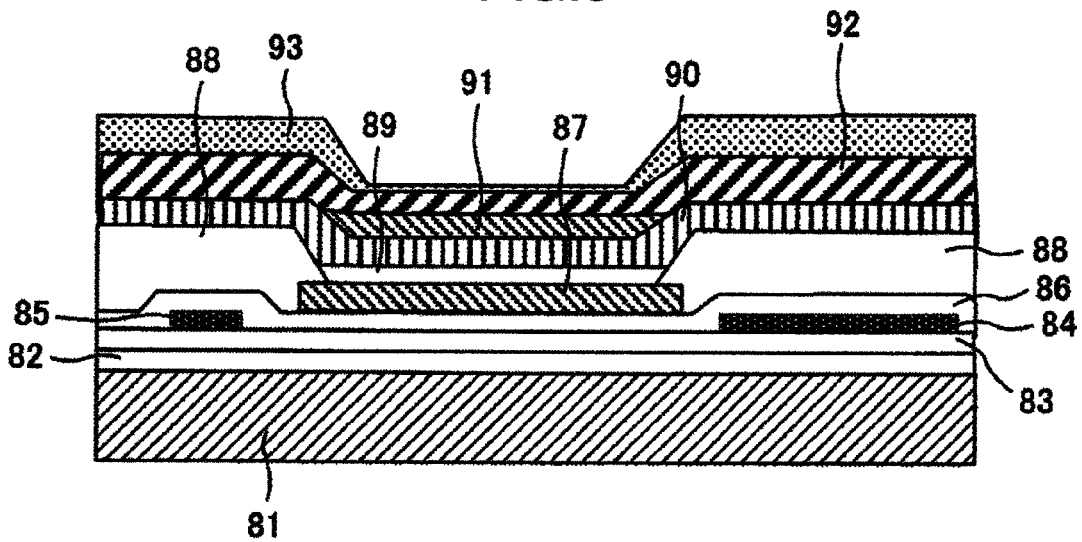
FIG. 9 is a cross-sectional view illustrating a red-color pixel in an organic light-emitting display device of the first embodiment of the present invention, manufactured in still another Example.
Figure 10:
FIG. 10 is a cross-sectional view illustrating an organic EL layer in the device illustrated in FIG. 9.

FIG. 9 presents a cross-sectional view illustrating a red-color pixel manufactured in Example 5, and FIG. 10 presents a cross-sectional view illustrating an organic EL layer 91 in the pixel illustrated in FIG. 9. The pixel manufactured in Example 5 is the same as that manufactured in Example 1, except that a moisture capturing layer 90 is disposed between a hole injection layer 89 and hole transporting layer 94. The pixel manufactured in Example 5 has a 1.2 times higher brightness half period than that manufactured in Comparative Example 1.

Example 6

Figure 11:
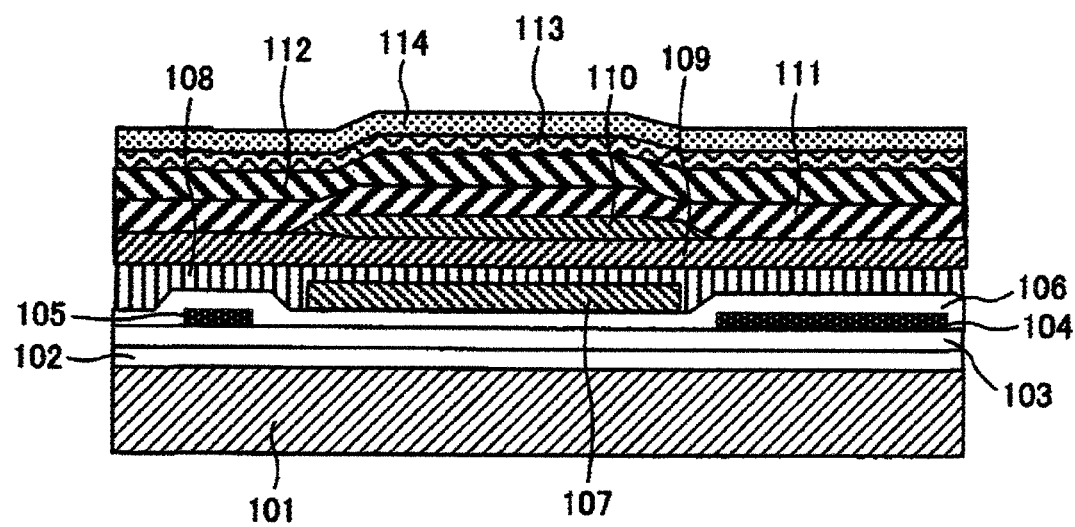
FIG. 11 is a cross-sectional view illustrating a red-color pixel in an organic light-emitting display device of the first embodiment of the present invention, manufactured in still another Example.

FIG. 11 presents a cross-sectional view illustrating a red-color pixel manufactured in Example 6. It is the same as that manufactured in Example 1, illustrated in FIG. 1, except that a liquid-repellent thin film of a fluorine compound, not shown in FIG. 11, is disposed in place of the bank 8 illustrated in FIG. 1 between the adjacent pixels. The thin film can be controlled for solubility/insolubility, when irradiated with light, to form the liquid-repellent segment between the adjacent pixels. This allows a light-emitting layer 110 to be formed selectively in the pixel.

The pixel manufactured in Comparative Example 2 is the same as that manufactured in Example 6, except that it has no moisture capturing layer 11 (illustrated in FIG. 1) in Comparative Example 2. The pixel manufactured in Example 6 has a 1.2 times higher red-color brightness half period than that manufactured in Comparative Example 2.

Example 7

Figure 12:
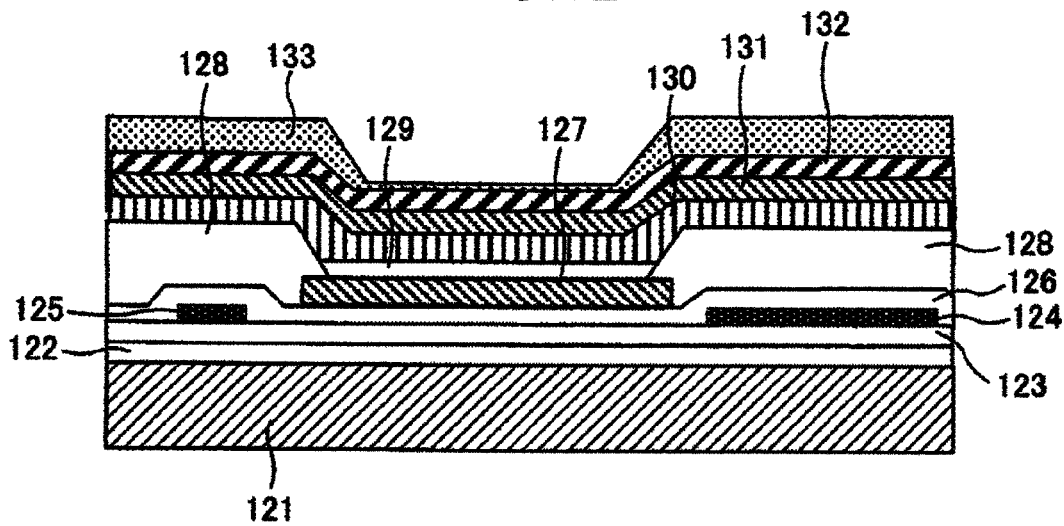
FIG. 12 is a cross-sectional view illustrating a red-color pixel in an organic light-emitting display device of the first embodiment of the present invention, manufactured in still another Example.

FIG. 12 presents a cross-sectional view illustrating a red-color pixel manufactured in Example 7, and FIG. 13 presents a cross-sectional view illustrating an organic EL layer 129 in the pixel illustrated in FIG. 12. The pixel manufactured in Example 7 is the same as that manufactured in Example 1, except that it uses a lower electrode (reflective electrode) having a laminated structure of Al/ITO, in place of the lower electrode (transparent electrode) in the pixel illustrated in FIG. 1. The laminate materials are not limited to the above. For example, Al may be replaced by Ag, or the like and ITO may be replaced by IZO or ZnO, which is also transparent. The laminated structure of metal and transparent, electroconductive film may be replaced by Cr or MoW.

The red-color pixel manufactured in Comparative Example 3 is the same as that manufactured in Example 7, except that it has no moisture capturing layer 131 illustrated in FIG. 12. The pixel manufactured in Example 7 has a 1.2 times higher red-color brightness half period than that manufactured in Comparative Example 3.

The organic light-emitting display device with the pixel manufactured in Example 7 has a so-called top cathode, top emission type structure. However, the present invention is not limited to this structure, and also applicable to a so-called top anode type structure.

Examples described above only describe a red-color emitting pixel. However, the present invention is also applicable to pixels emitting other colors by adequately selecting materials for the light-emitting dopant, hole transporting layer and electron transporting layer. For example, the present invention can emit green and blue colors by using the light-emitting dopants represented by respective Formulae [d2] and [d3] as follows. The materials are not limited to the above. Use of a material of point-asymmetric structure can further improve device performance.

[Formula 4]

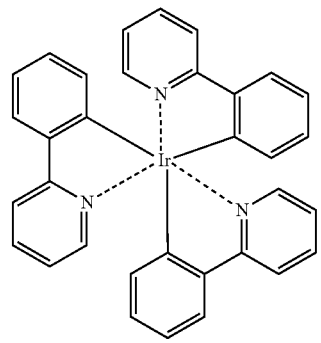

[d2]

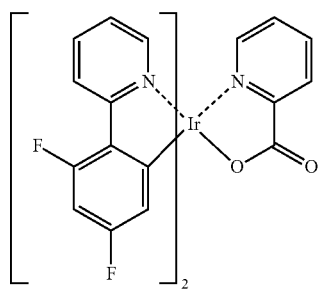

[d3]

Example 1A

Figure 2A:
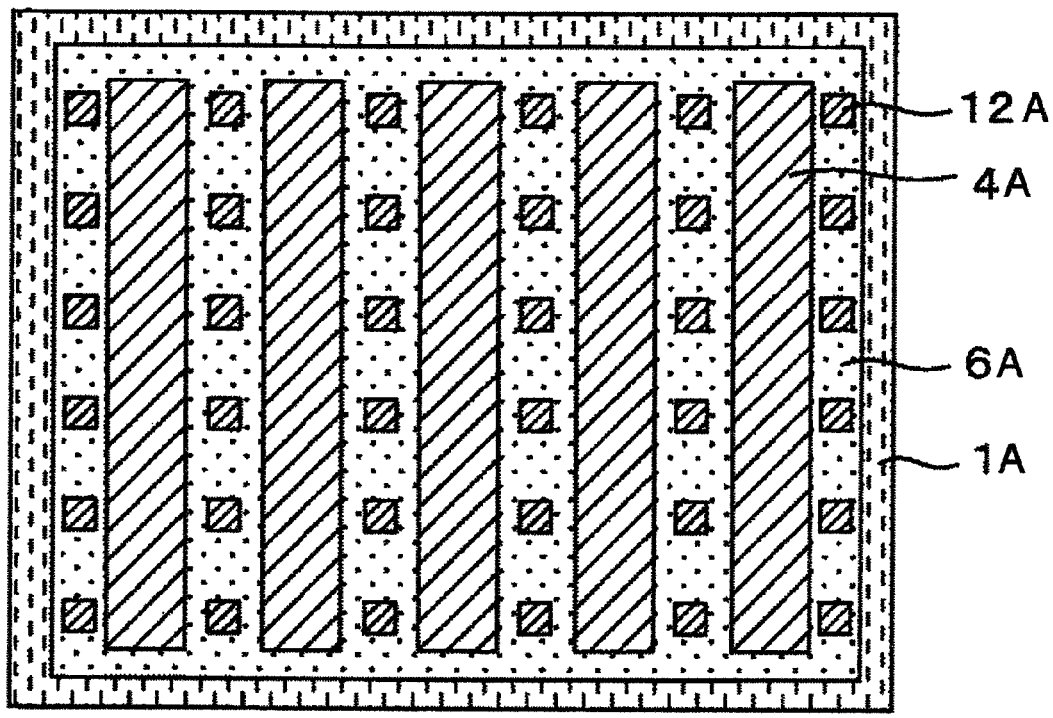
FIG. 2A is a plan view illustrating the device illustrated in FIG. 1A.

Examples (Examples 1A to 7A) for manufacturing the organic light-emitting devices of the second embodiment of the present invention are described. First, the organic light-emitting device manufactured in Example 1A is described. FIG. 1A presents a cross-sectional view illustrating an organic light-emitting device manufactured in Example 1A, and FIG. 2A presents a plan view illustrating the device illustrated in FIG. 1A.

The organic light-emitting device has a metallic substrate 2A which supports an organic light-emitting element composed of a lower reflective electrode 4A serving as an anode, hole transporting layer 7A, white-color-emitting layer 8A, electron transporting layer 9A, electron injection layer 10A and upper transparent electrode 11A serving as a cathode, disposed in this order from the substrate 2A. It may have a hole injection layer, as required, disposed between the lower reflective electrode 4A and hole transporting layer 7A. Moreover, it may have a structure with the hole transporting layer 7A and electron transporting layer 9A serving as the white-color-emitting layer 8A.

The upper transparent electrode 11A transmits emitted light, and the lower reflective electrode 4A reflects emitted light.

The device also has a sealing substrate 14A disposed on the upper transparent electrode 11A in the light-emitting element. The sealing substrate 14A works to block inflow of $H_2O$ and $O_2$ present in the atmosphere into the upper transparent electrode 11A and organic layers disposed below (hole transporting layer 7A, electron transporting layer 9A and white-color-emitting layer 8A). The materials useful for the sealing substrate 14A include inorganic materials, e.g., $SiO_2$, SiNx and $Al_2O_3$; and organic compounds, e.g., polychloropyrene, polyethyleneterephthalate, polyoxymethylene, polyvinyl chloride, polyvinylidene fluoride, cyanoethylpullulan, polymethylmethacrylate, polysulfone, polycarbonate and polyimide.

The metallic substrate 2A is coated with a 2 μm thick acrylic insulating layer as a first interlayer insulating film 3A on the light-emitting element side, and with an insulating film 1A on the other side. Example 1A uses an acrylic insulating layer for the first interlayer insulating film 3A. Other materials useful for the film 3A include organic insulating materials, e.g., polychloropyrene, polyethyleneterephthalate, polyoxymethylene, polyvinyl chloride, polyvinylidene fluoride, cyanoethylpullulan, polymethylmethacrylate, polysulfone, polycarbonate and polyimide; and inorganic materials, e.g., $SiO_2$, SiNx and $Al_2O_3$. They may be used either individually or in combination. For example, the film 3A may have a laminated structure with an inorganic insulating film disposed on an organic insulating film.

The metallic substrate 2A is an electroconductive substrate and also works as an auxiliary interconnector for applying a voltage to the light-emitting element (composed of the lower reflective electrode 4A, hole transporting layer 7A, white-color-emitting layer 8A, electron transporting layer 9A, electron injection layer 10A and upper transparent electrode 11A) or as the reflective electrode capable of reflecting emitted light. Any material may be used for the metallic substrate 2A, so long as it is electroconductive. The useful materials include metals, e.g., aluminum, indium, molybdenum, nickel, copper, iron and their alloys.

The insulating film 1A insulates the metallic substrate 2A to which to a voltage is applied. Organic insulating materials are useful for the insulating film 1A. These materials include acryl, polychloropyrene, polyethyleneterephthalate, polyoxymethylene, polyvinyl chloride, polyvinylidene fluoride, cyanoethylpullulan, polymethylmethacrylate, polysulfone, polycarbonate and polyimide.

Next, the first interlayer insulating film 3A is provided with a plurality of contact holes 12A. The film 3A is coated with a 150 nm thick Al film to form the lower reflective electrode 4A and connecting electrode 5A. Example 1A uses an aluminum film for the lower reflective electrode 4A. The film material is not limited to aluminum, and the useful materials include metals, e.g., indium, molybdenum, nickel and their alloys; and inorganic materials, e.g., polysilicon and amorphous silicon. Also preferable are laminated structures with an electroconductive, transparent electrode of tin oxide, indium oxide, indium-tin-oxide (ITO) or the like disposed on the above metals or their alloys.

Example 1A forms the lower reflective electrode 4A and connection electrode 5A using the same aluminum film. However, they may be made of different materials. For example, the lower reflective electrode 4A may be made of a laminated film with an Al film and In—Sn—O film (ITO film), and the connection electrode 5A may be made of an ITO film. A different metallic film may be made for each of these electrodes.

Next, a second interlayer insulating film 6A is formed to cover the lower reflective electrode 4A and connection electrode 5A edges. Example 1A also uses an acrylic insulating film for the film 6A. However, another compound may be used for the film. The useful compounds for the film 6A include organic compounds, e.g., polychloropyrene, polyethyleneterephthalate, polyoxymethylene, polyvinyl chloride, polyvinylidene fluoride, cyanoethylpullulan, polymethylmethacrylate, polysulfone, polycarbonate and polyimide; and inorganic materials, e.g., $SiO_2$, SiNx and $Al_2O_3$. Moreover, the film 6A may have a laminated structure with an inorganic insulating film disposed on an organic insulating film.

Next, a 50 nm thick 4,4'-bis[N-(1-naphthyl)-N-phenylamino]biphenyl (α-NPD) vacuum deposition film is formed on the lower reflective electrode 4A by a vacuum deposition method. The vacuum deposition film is disposed around the lower reflective electrode 4A but not on the connection electrode 5A to work as the hole transporting layer 7A.

Example 1A uses α-NPD vacuum deposition film for the hole transporting layer 7A. However, other compounds may be used. The hole transporting layer 7A transports holes and injects them into the white-color-emitting layer 8A. Therefore, it is preferably made of a hole transporting material of high hole mobility. It is also preferable that the layer 7A is made of a compound which is chemically stable, low in ionization potential, low in affinity for electrons and high in glass transition temperature. The preferable compounds for the layer 7A include:

N,N'-bis(3-methylphenyl)-N,N'-diphenyl-[1,1'-biphenyl]-4,4'-diamine (TPD),
4,4'-bis[N-(1-naphthyl)-N-phenylamino]biphenyl (α-NPD),
1,3,5-tris[N-(4-diphenylaminophenyl)phenylamino]benzene (p-DPA-TDAB),
4,4'-4"-tris(N-carbazol)triphenylamine (TCTA),
1,3,5-tris[N,N-bis(2-methylphenyl)-amino]-benzene (o-MTDAB),
1,3,5-tris[N,N-bis(3-methylphenyl)-amino]-benzene (m-MTDAB),
1,3,5-tris[N,N-bis(4-methylphenyl)-amino]-benzene (p-MTDAB),
4,4',4"-tris[1-naphthyl(phenyl)amino]triphenylamine (1-TNATA),
4,4',4"-tris[2-naphthyl(phenyl)amino]triphenylamine (2-TNATA),
4,4',4"-tris[biphen-4-yl-(3-methylphenyl)amino]triphenylamine (p-PMTDATA),
4,4',4"-tris[9,9-dimethylfluoren-2-yl(phenyl)amino]triphenylamine (TFATA),
4,4',4"-tris(N-carbazoyl)triphenylamine (TCTA),
1,3,5-tris-[N-(4-diphenylaminophenyl)phenylamino]benzene (p-DPA-TDAB),
1,3,5-tris-{4-[methylphenyl(phenyl)amino]phenyl}benzene (MTDAPB),
N,N'-di(biphen-4-yl)-N,N'-diphenyl[1,1'-biphenyl]-4,4'-diamine (p-BPD),
N,N'-bis(9,9-dimethylfluoren-2-yl)-N,N'-diphenylfluorene-2,7-diamine (PFFA),
N,N,N',N'-tetrakis(9,9-dimethylfluoren-2-yl)-[1,1-biphenyl]-4,4'-diamikne (FFD), (NDA)PP, and 4-4'-bis[N,N'-(3-tolyl)amino]-3-3'-dimethylbiphenyl (HMTPD). They may be used either individually or in combination.

A hole injection layer may be disposed, as required, between the lower reflective electrode 4A and the hole transporting layer 7A. The hole injection layer preferably has an adequate ionization potential for lowering an injection barrier between the lower reflective electrode 4A and the hole transporting layer 7A. It also preferably works to smoothen rough surface of an under layer. The useful compounds for the hole injection layer include, but not limited to, copper phthalocyanine, starburst amine, polyaniline, polythiophene, vanadium oxide, molybdenum oxide, ruthenium oxide and aluminum oxide.

The hole transporting material may be incorporated with an oxidant, to lower a barrier between it and the lower reflective electrode 4A or improve its electroconductivity. The useful oxidants include, but not limited to, Lewis acid compounds, e.g., ferric chloride, ammonium chloride, gallium chloride, indium chloride, antimony pentachloride; and electron acceptable compounds, e.g., trinitrofluorene; and vanadium oxide, molybdenum oxide ruthenium oxide and aluminum oxide cited as the hole injection compounds. They may be used either individually or in combination.

Next, the hole transporting layer 7A is coated with a 20 nm thick composite film (co-deposited film) with 4,4'-di(N-carbazole) biphenyl (CBP) and bis[2-(2'-benzo[4,5-a]thienyl) pyridinate-N,C3']iridium(acetylacetonate) ($Brp_2Ir(acac)$), co-deposited under a vacuum. The CBP and $Brp_2Ir(acac)$ deposition rates are set at 0.20 nm/second and 0.02 nm/second, respectively. $Brp_2Ir(acac)$ works as a dopant that determines emitted light color. The composite film of CBP and $Brp_2Ir$ (acac) is pattered using a precision mask with a pattern of openings, each being similar in size to the lower reflective electrode 4A.

Next, the composite film of CBP and $Brp_2Ir(acac)$ is coated with a 40 nm thick composite film (co-deposited film) with CBP and iridium complex ($Ir(ppy)_3$) co-deposited under a vacuum. The CBP and $Ir(ppy)_3$ deposition rates are set at 0.20 nm/second and 0.02 nm/second, respectively. $Ir(ppy)_3$ works as a dopant that determines emitted light color. The CBP/Ir (ppy)$_3$ composite film is pattered using a precision mask with a pattern of openings, each being similar in size to the lower reflective electrode 4A.

The above two-layered co-deposited structure (film) works as the white-color-emitting layer 8A. Example 1A uses a laminated structure of red-color-emitting and blue-color-emitting films for the white-color-emitting layer 8A. However, the structure is not limited to the above. More specifically, the structures of the white-color-emitting layer 8A may be two-layered laminate with orange-color-emitting and blue-color-emitting layers, and yellow-color-emitting and blue-color-emitting layers; three-layered laminate with red-color-emitting, green-color-emitting and blue-color-emitting layers; and single layer incorporated with a plurality species of light-emitting dopants dispersed in the host material.

The white-color-emitting layer 8A provides the space in which injected holes and electrons are recombined with each other to emit light of wavelength determined by the layer constituent, wherein light is emitted from the host material itself forming the white-color-emitting layer 8A or from a small amount of the light-emitting dopant dispersed in the host material. The useful host materials include, but not limited to, a distyrylarylene derivative (DPVBi), silole derivative with a benzene ring in the skeleton (2PSP), oxadiazole derivative with a triphenylamine structure at both ends (EM2), perinone derivative with a phenanthrene group (P1), oligothiophene derivative with a triphenylamine structure at both ends (BMA-3T), perylene derivative (t-Bu-PTC), tris(8-quinolinol) aluminum, polyparaphenylenevinylene derivative, polythiophene derivative, polyparaphenylene derivative, polysilane derivative and polyacetylene derivative. They may be used either individually or in combination.

The useful dopant materials include, but not limited to, quinacridone, coumarin 6, Nile red, rubrene, 4-(dicyanomethylene)-2-methyl-6-(para-dimethylaminostyryl)-4H-pyrane (DCM), dicarbazole derivative, porphyrin/platinum complex (PtOEP), iridium complex ($Ir(ppy)_3$). They may be used either individually or in combination.

Next, the white-light-emitting layer 8A is coated with a 15 nm thick tris(8-quinolinolate)aluminum ($Alq_3$) film by vacuum deposition. The deposited film works as the electron transporting layer 9A.

The electron transporting layer 9A transports (transfers) electrons and injects them into the white-color-emitting layer 8A. Therefore, it is preferably made of an electron transporting material of high electron mobility. The materials useful for the layer 9A are not limited, but the preferable ones include tris(8-quinolinol) aluminum, oxadiazole derivative, silole derivative, zinc/benzothiazole complex and basocuproin (BCP). They may be used either individually or in combination.

The electron transporting (transfer) material for the electron transporting layer 9A is preferably incorporated with a reductant, to lower a barrier between it and the upper transparent electrode 11A or improve its electroconductivity. The useful reductants include, but not limited to, alkaline metals, alkaline-earth metals, alkaline metal oxides, alkaline-earth metal oxides, rare-earth metal oxides, alkaline metal halides, alkaline-earth metal halides, rare earth metal halides and alkaline metal/aromatic compound complexes, of which especially preferable alkaline metals are Cs, Li, Na and K. They may be used either individually or in combination.

Next, the electron transporting layer 9A is coated with a Mg/Ag composite film working as the electron injection layer 10A by co-deposition carried out under a vacuum, wherein the Mg and Ag deposition rates are set at 0.14±0.05 nm/second and 0.01±0.005 nm/second, respectively.

The electron injection layer 10A works to improve efficiency of injecting electrons transferred from the upper transparent electrode 11A into the electron transporting layer 9A. The preferable materials for the layer 10A include, but not limited to, lithium fluoride, magnesium fluoride, calcium fluoride, strontium fluoride, barium fluoride, magnesium fluoride and aluminum fluoride. They may be used either individually or in combination.

Next, a 50 nm thick amorphous In—Zn—O (IZO) film working as the upper transparent electrode 11A is formed by sputtering with a target of In and Zn (In/(In+Zn) ratio: 0.83) under the conditions of atmosphere: mixed $Ar/O_2$ gas, degree of vacuum: 0.2 Pa and sputtering output: 2 $W/cm^2$. The laminate of the Mg/Ag film and IZO film has a light transmittance of 65%.

The upper transparent electrode 11A is electrically connected to the metallic substrate 2A via the connecting electrode 5A contacting with the contact holes 12A. Example 1A uses the connecting electrode 5A to prevent disconnection between the upper transparent electrode 11A and metallic substrate 2A at the contact holes 12A. However, the upper transparent electrode 11A may be connected to the metallic substrate 2A.

Thus, an OLED substrate 13A is formed, the substrate being provided with the metallic substrate 2A and a plurality of the stripe-shape organic light emitting elements (each comprising the lower reflective electrode 4A, hole transporting layer 7A, white-color-emitting layer 8A, electron transporting layer 9A, electron injection layer 10A and upper transparent electrode 11A).

Next, the OLED substrate 13A is transferred to a sealing chamber kept at a high dew point in a circulated flow of dry nitrogen to prevent it from being exposed to the atmosphere.

Next, a glass substrate, which serves as a sealing substrate 14A, is put in the sealing chamber. The sealing substrate 14A is provided with a photo-curable resin running along the substrate edges by a known seal dispenser (not shown).

The sealing substrate 14A is pressure-bonded to the OLED substrate 13A in the sealing chamber. A known light-shielding plate is disposed outside of the sealing substrate 14A to prevent the whole light-emitting device from being irradiated with ultraviolet ray, and the resulting assembly is irradiated with UV ray from the sealing substrate 14A side to cure the photo-curable resin.

Thus, the organic light-emitting device of Example 1A is manufactured.

Example 1A disposes a plurality of the contact holes 12A and stripe-shape lower reflective electrodes 4A in such a way that the holes 12 A face each side of the electrode 4A, as illustrate in FIG. 2A. As a result, the upper transparent electrode 11A is connected to the metallic substrate 2A of low resistance via the contact holes 12A, to reduce wiring resistance in the upper transparent electrode 11A, thereby reducing power consumption caused by wiring resistance. Moreover, temperature rise caused by wiring resistance is reduced to suppress deteriorated service life of the light-emitting element.

Example 2A

Figure 3A:
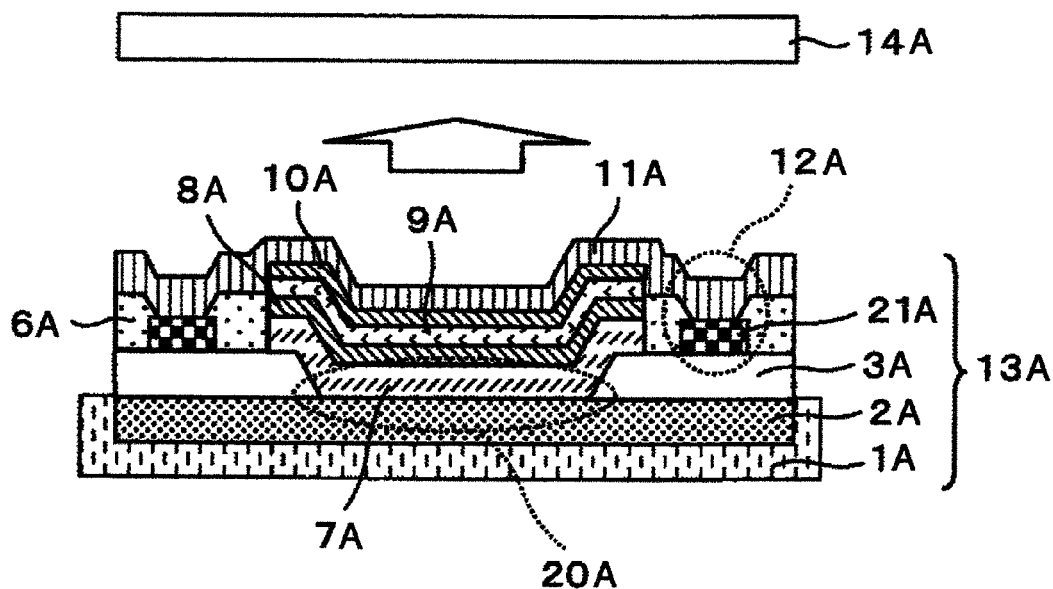
FIG. 3A is a cross-sectional view illustrating an organic light-emitting device, manufactured in Example 2A.
Figure 4A:
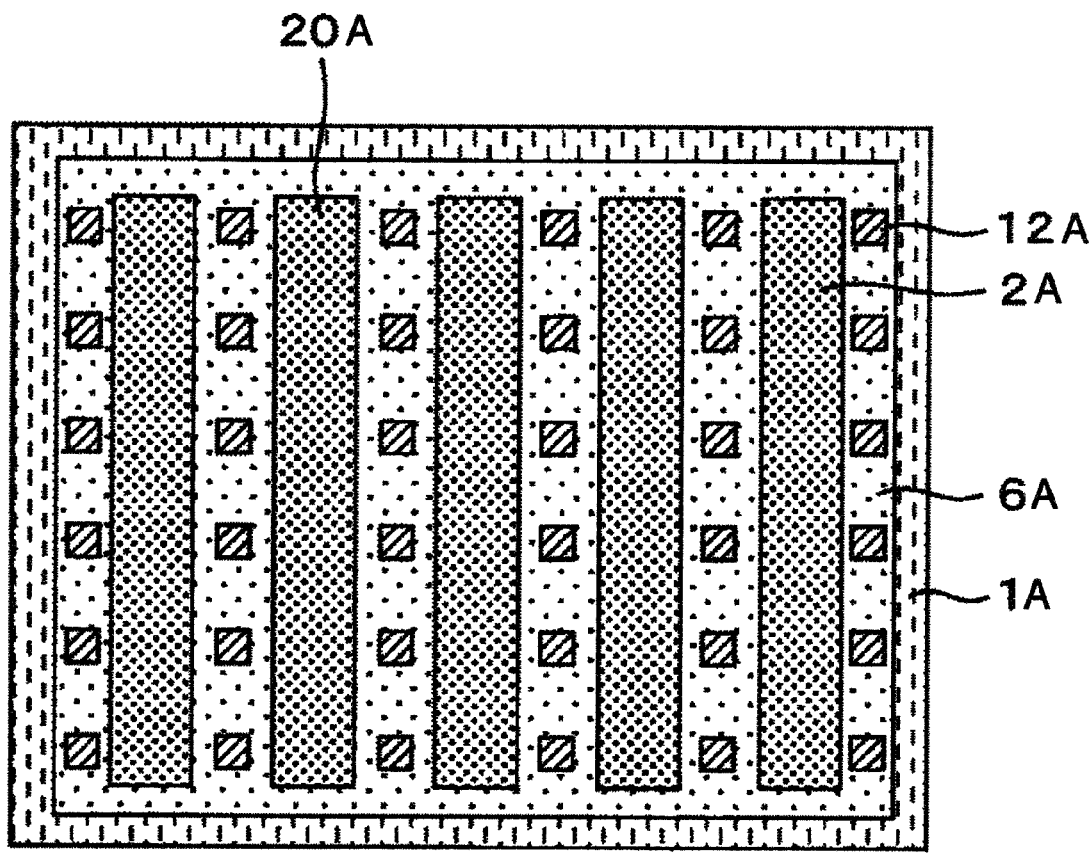
FIG. 4A is a plan view illustrating the device illustrated in FIG. 3A.

The organic light-emitting device manufactured in Example 2A is described. FIG. 3A presents a cross-sectional view illustrating the organic light-emitting device manufactured in Example 2A, and FIG. 4A presents a plan view illustrating the device illustrated in FIG. 3A, wherein the component playing the same role as that of the component described above is marked with the same numeral, and description of that component is partly omitted. In Example 2A, a metallic substrate 2A serves as a reflective electrode capable of reflecting emitted light.

The metallic substrate 2A is coated with a first interlayer insulating film 3A on one side and with an insulating film 1A on the other side, wherein the first interlayer insulating film 3A is provided with a plurality of stripe-shape contact holes 20A in the portion facing a lower reflective electrode for the organic light-emitting element.

Next, an auxiliary interconnector 21A is disposed on the first interlayer insulating film 3A, and then a second interlayer insulating film 6A is disposed thereon. The film 6A is provided with the auxiliary interconnector 21A and contact holes 12A in the portion facing a lower reflective electrode for the organic light-emitting element.

Next, a hole transporting layer 7A, white-color-emitting layer 8A, electron transporting layer 9A, electron injection layer 10A and upper transparent electrode 11A are disposed in a manner similar to that for Example 1A.

Next, the OLED substrate 13A and sealing substrate 14A are sealed in a manner similar to that for Example 1A.

Example 2A electrically connects the upper transparent electrode 11A and auxiliary interconnector 21A to each other to reduce wiring resistance in the upper transparent electrode 11A, thereby reducing power consumption caused by wiring resistance. Moreover, temperature rise caused by wiring resistance is reduced to suppress deteriorated service life of the light-emitting element.

Moreover, Example 2A uses the metallic substrate 2A as the lower reflective electrode in the light-emitting element, thereby simplifying the layered structure, and decreasing the manufacturing process steps and the production cost.

Example 3A

Figure 5A:
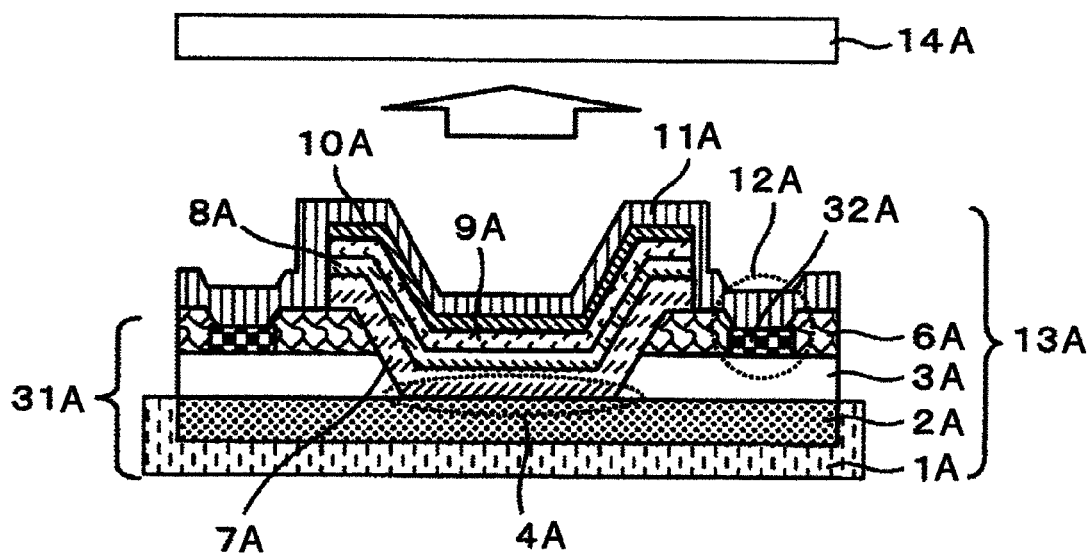
FIG. 5A is a cross-sectional view illustrating an organic light-emitting device, manufactured in Example 3A.
Figure 6A:
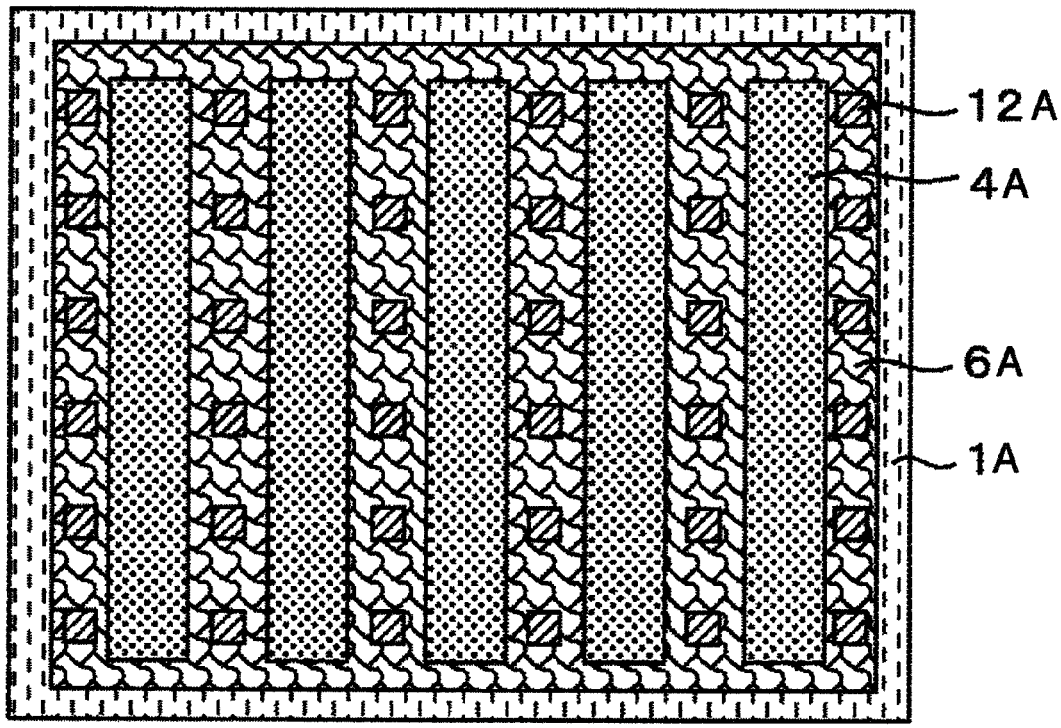
FIG. 6A is a plan view illustrating the device illustrated in FIG. 5A.

The organic light-emitting device manufactured in Example 3A is described. FIG. 5A presents a cross-sectional view illustrating the organic light-emitting device manufactured in Example 3A, and FIG. 6A presents a plan view illustrating the device illustrated in FIG. 5A, wherein the component playing the same role as that of the component described above is marked with the same numeral, and description of that component is partly omitted. Example 3A disposes a light-emitting element on a composite substrate 31A provided with an auxiliary interconnector 32A, to simplify the layered structure.

The composite substrate 31A has the following structure. It comprises a metallic substrate 2A coated with a first interlayer insulating film 3A on one side and with an insulating film 1A on the other side, the first interlayer insulating film 3A being provided with a plurality of stripe-shape contact holes, wherein the metallic substrate 2A portions facing the openings serve as a lower reflective electrode of the organic light-emitting element. It also comprises the auxiliary interconnector 32A and a second interlayer insulating film 6A disposed on the interconnector 32A. The film 6A is provided with contact holes 12A in the portions facing the auxiliary interconnector and lower reflective electrode in the organic light-emitting element.

Next, a hole transporting layer 7A, white-color-emitting layer 8A, electron transporting layer 9A, electron injection layer 10A and upper transparent electrode 11A are disposed on the composite substrate 31A in a manner similar to that for Example 1A.

Next, the OLED substrate 13A and sealing substrate 14A are sealed in a manner similar to that for Example 1A.

Example 3A electrically connects the upper transparent electrode 11A and auxiliary interconnector 32A to each other to reduce wiring resistance in the upper transparent electrode 11A, thereby reducing power consumption caused by wiring resistance. Moreover, temperature rise caused by wiring resistance is reduced to suppress deteriorated service life of the OLED element.

Moreover, Example 3A uses the metallic substrate 2A as the lower reflective electrode in the light-emitting element, thereby simplifying the layered structure, and decreasing the manufacturing process steps and the production cost.

Example 4A

Figure 7A:
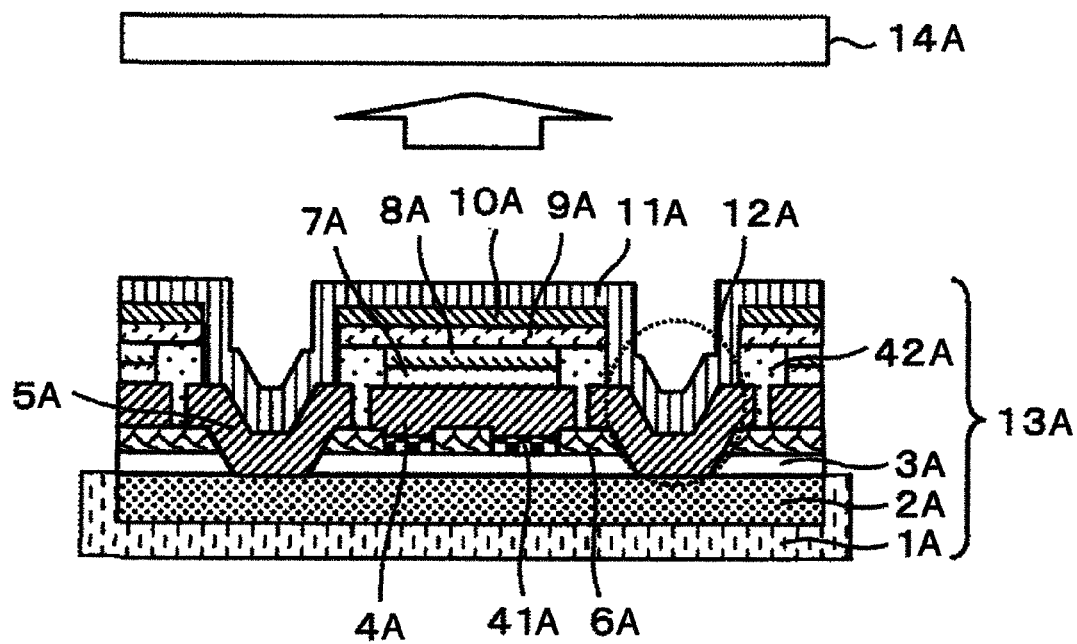
FIG. 7A is a cross-sectional view illustrating an organic light-emitting device, manufactured in Example 4A.
Figure 8A:
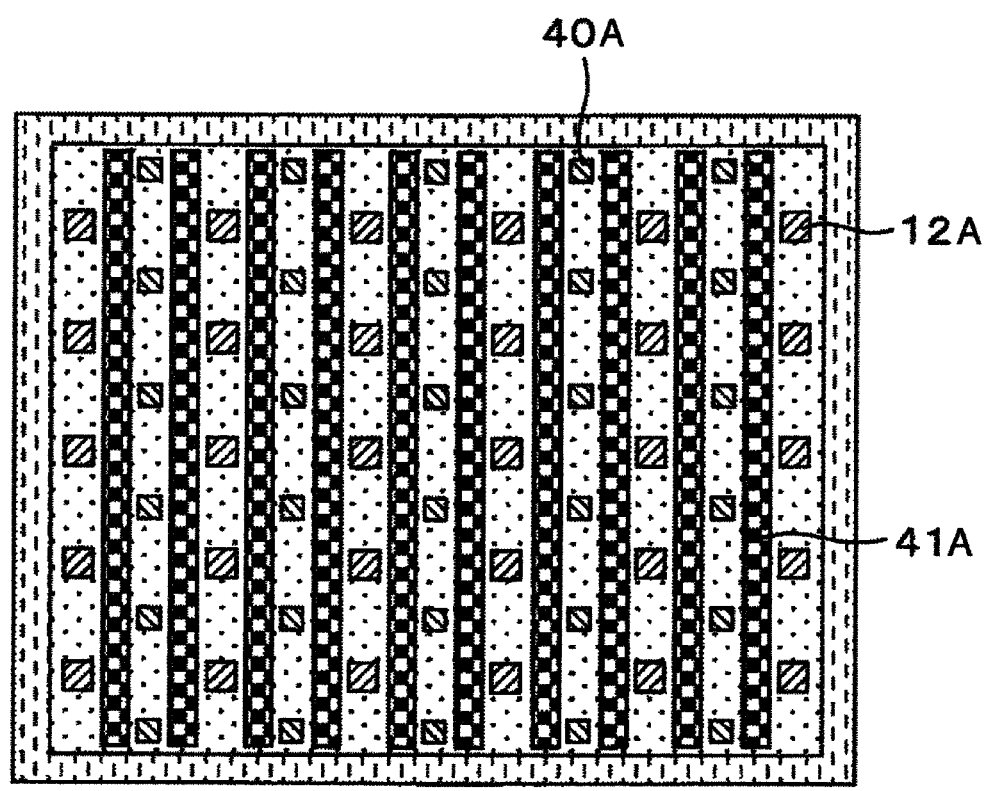
FIG. 8A is a plan view illustrating the device illustrated in FIG. 7A.
Figure 9A:
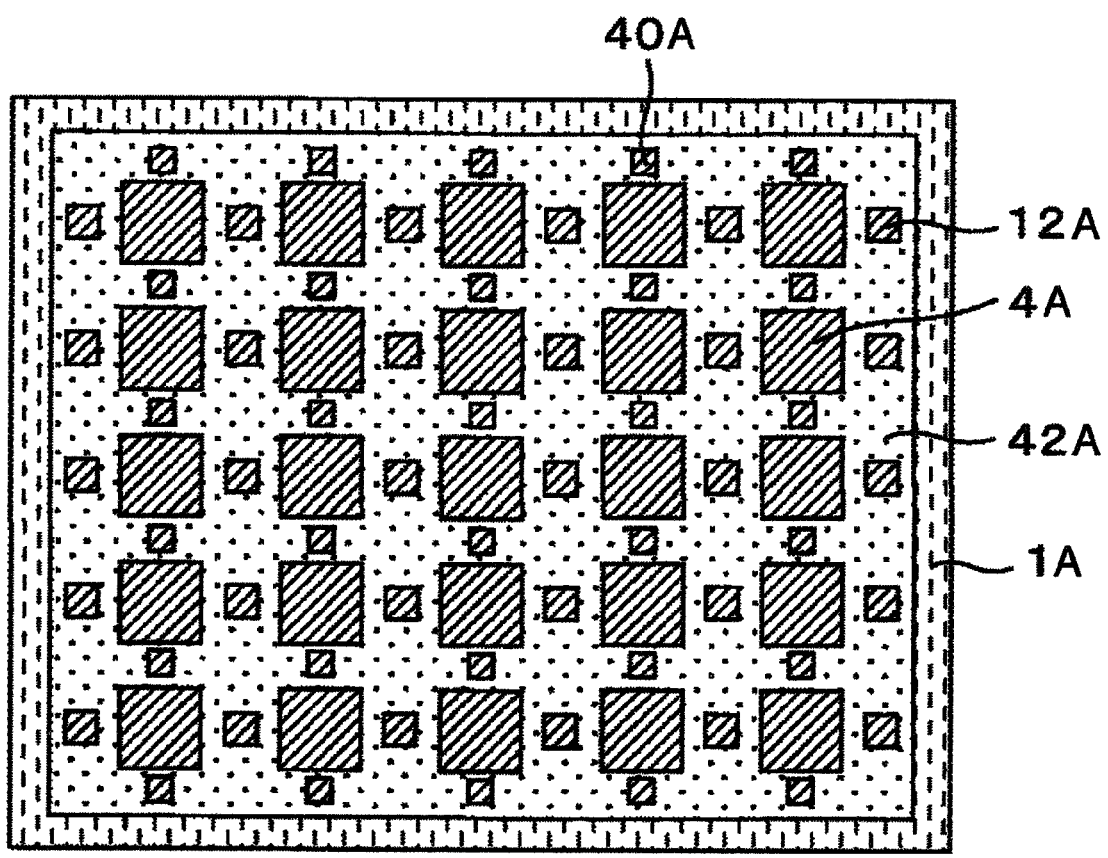
FIG. 9A is a plan view illustrating the device illustrated in FIG. 7A.

The organic light-emitting device manufactured in Example 4A is described. FIG. 7A presents a cross-sectional view illustrating the organic light-emitting device manufactured in Example 4A, and FIGS. 8A and 9A present plan views illustrating the device illustrated in FIG. 7A, wherein the component playing the same role as that of the component described above is marked with the same numeral, and description of that component is partly omitted. Example 4A disposes auxiliary interconnectors 41A in such a way to arrange the pixels in the organic light-emitting element in a point-like pattern.

A metallic substrate 2A is coated with a first interlayer insulating film 3A on one side and with an insulating film 1A on the other side. Contact holes 12A and 40A are disposed to surround each of the lower reflective electrodes 4A arranged in a point-like pattern. The auxiliary interconnector 41A is disposed on the first interlayer insulating film 3A.

The two auxiliary interconnectors 41 are provided on the left and right sides of the contact holes 12A for each of the lower reflective electrodes 4A. However, they may be brought together into a single interconnector by changing their positions.

Then, a second interlayer insulating film 6A, lower reflective electrode 4A, connecting electrode 5A and third interlayer insulating film 42A are disposed on the first interlayer insulating film 3A in a manner similar to that for Example 1A.

Next, a hole transporting layer 7A, white-color-emitting layer 8A, electron transporting layer 9A, electron injection layer 10A and upper transparent electrode 11A are disposed in a manner similar to that for Example 1A.

Next, the OLED substrate 13A and sealing substrate 14A are sealed in a manner similar to that for Example 1A.

Example 4A electrically connects the upper transparent electrode 11A and metallic substrate 2A to each other to reduce wiring resistance in the upper transparent electrode 11A, thereby reducing power consumption caused by wiring resistance. Moreover, temperature rise caused by wiring resistance is reduced to suppress deteriorated service life of the organic light-emitting element.

Moreover, Example 4A disposes the auxiliary interconnectors 41A in such a way to arrange the lower reflective electrodes in a point-like pattern. The contact holes 12A and 40A are disposed around the lower reflective electrode 4A to connect the upper transparent electrode 11A and metallic substrate 2A to each other, thereby further reducing wiring resistance in the upper transparent electrode 11A.

Example 5A

Figure 10A:
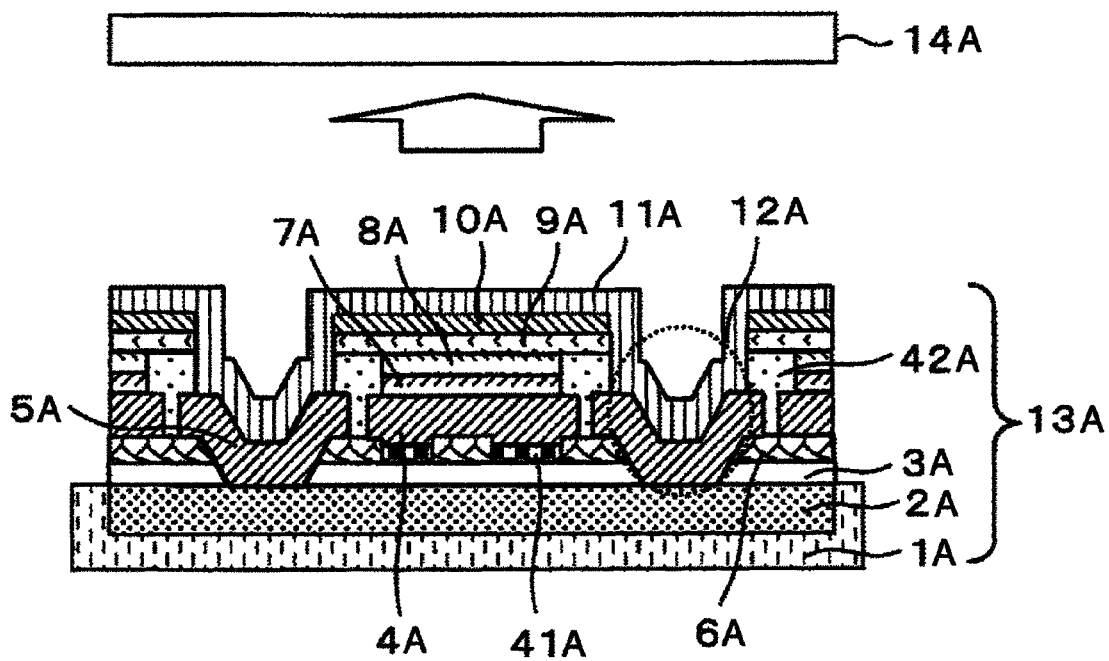
FIG. 10A is a cross-sectional view illustrating an organic light-emitting device, manufactured in Example 5A.
Figure 11A:
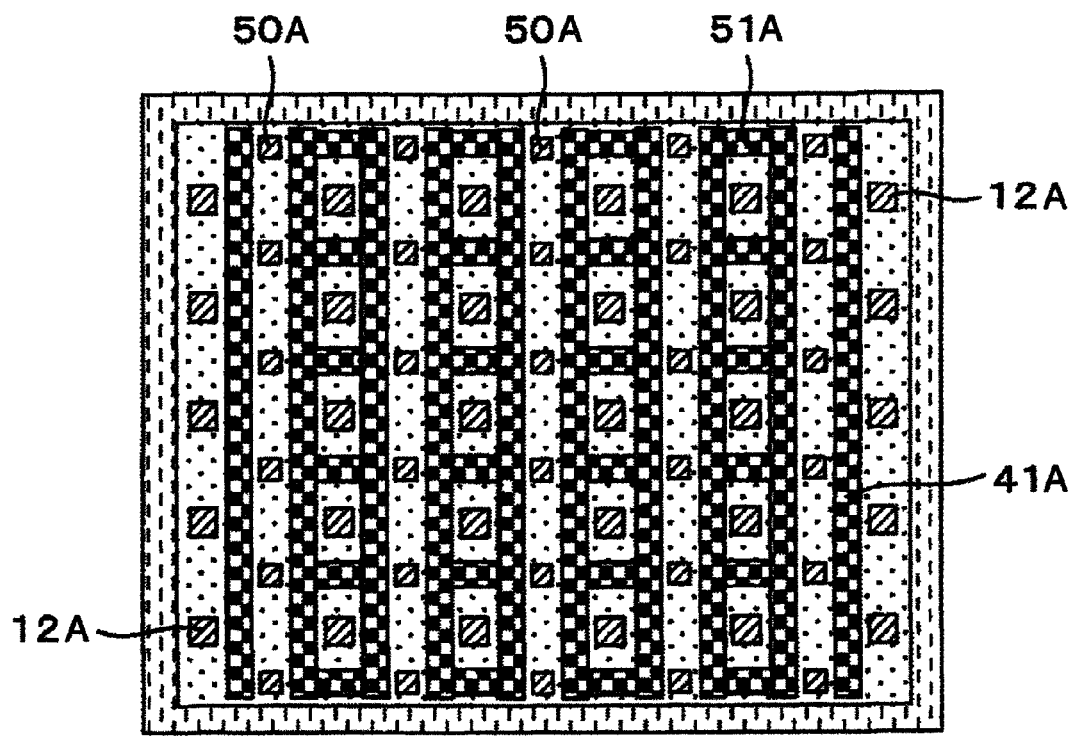
FIG. 11A is a plan view illustrating the device illustrated in FIG. 10A.
Figure 12A:
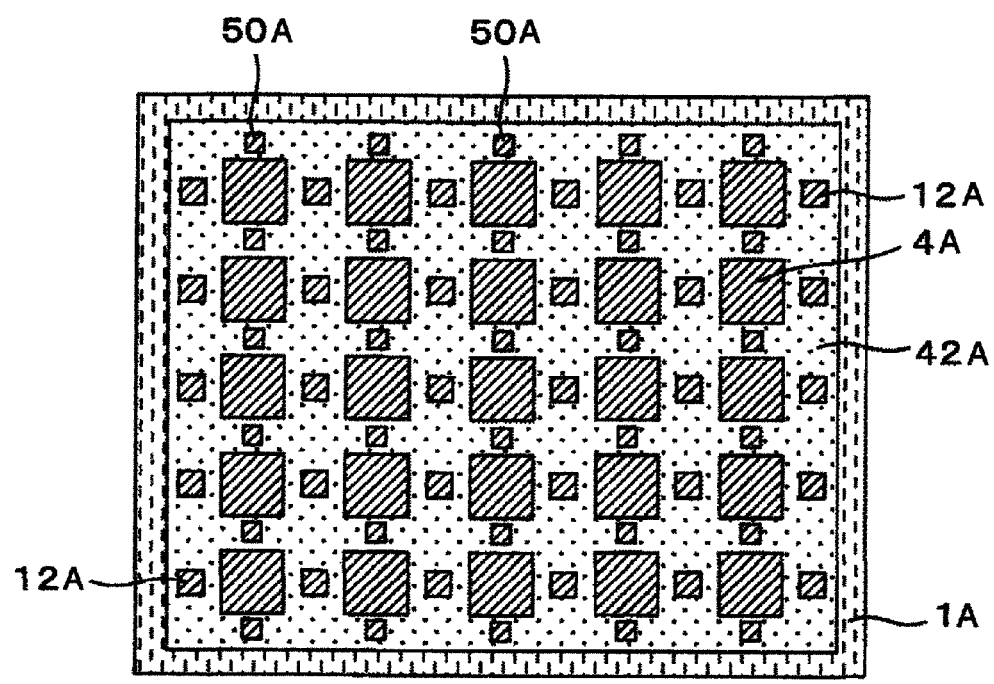
FIG. 12A is a plan view illustrating the device illustrated in FIG. 10A.

The organic light-emitting device manufactured in Example 5A is described. FIG. 10A presents a cross-sectional view illustrating the organic light-emitting device manufactured in Example 5A, and FIGS. 11A and 12A present plan views illustrating the device illustrated in FIG. 10A, wherein the component playing the same role as that of the component described above is marked with the same numeral, and description of that component is partly omitted. Example 5A connects auxiliary interconnectors 41A running in the horizontal direction to auxiliary interconnectors 51A running in the vertical direction, in order to arrange the pixels in the organic light-emitting element in a point-like pattern.

A metallic substrate 2A is coated with a first interlayer insulating film 3A on one side and with an insulating film 1A on the other side in a manner similar to that for Example 1A. Then, the auxiliary interconnectors 41A and 51A are disposed on the film 3A. Arrangement of these interconnectors 41A and 51A is illustrated in FIG. 11A. The interconnector 51A connects the interconnectors 41A in the adjacent lower reflective electrodes 4A right and left. Example 5A does not continuously connect the interconnectors 51A from one end to the other end. However, they may be connected from one end to the other end by changing the contact hole 50A positions. Example 5A uses the same material for the interconnectors 41A and 51A. However, they may be made of materials different from each other.

Then, a second interlayer insulating film 6A, lower reflective electrode 4A, connecting electrode 5A and third interlayer insulating film 42A are disposed on the first interlayer insulating film 3A in a manner similar to that for Example 1A.

Next, a hole transporting layer 7A, white-color-emitting layer 8A, electron transporting layer 9A, electron injection layer 10A and upper transparent electrode 11A are disposed in a manner similar to that for Example 4A.

Next, the OLED substrate 13A and sealing substrate 14A are sealed in a manner similar to that for Example 4A.

Example 5A electrically connects the upper transparent electrode 11A and metallic substrate 2A to each other to reduce wiring resistance in the upper transparent electrode 11A, thereby reducing power consumption caused by wiring resistance. Moreover, temperature rise caused by wiring resistance is reduced to suppress deteriorated service life of the organic light-emitting element.

Example 5A disposes the auxiliary interconnectors 41A in such a way to arrange the pixels in the organic light-emitting element in a point-like pattern. The contact holes 50A are disposed between the adjacent lower reflective electrodes 4A one on the other, to connect the upper transparent electrode 11A and metallic substrate 2A to each other. This further reduces wiring resistance in the upper transparent electrode 11A.

Still more, Example 5A disposes the auxiliary interconnectors 51A, to further reduce wiring resistance in the lower reflective electrode 4A.

Example 6A

Figure 13A:
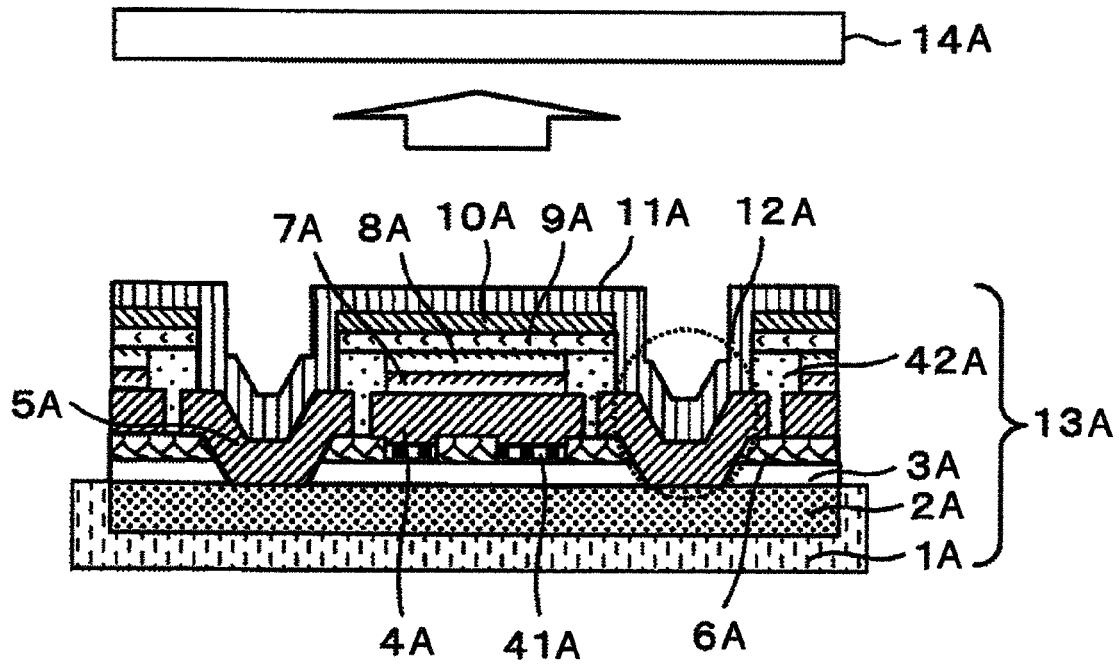
FIG. 13A is a cross-sectional view illustrating an organic light-emitting device, manufactured in Example 6A.
Figure 14A:
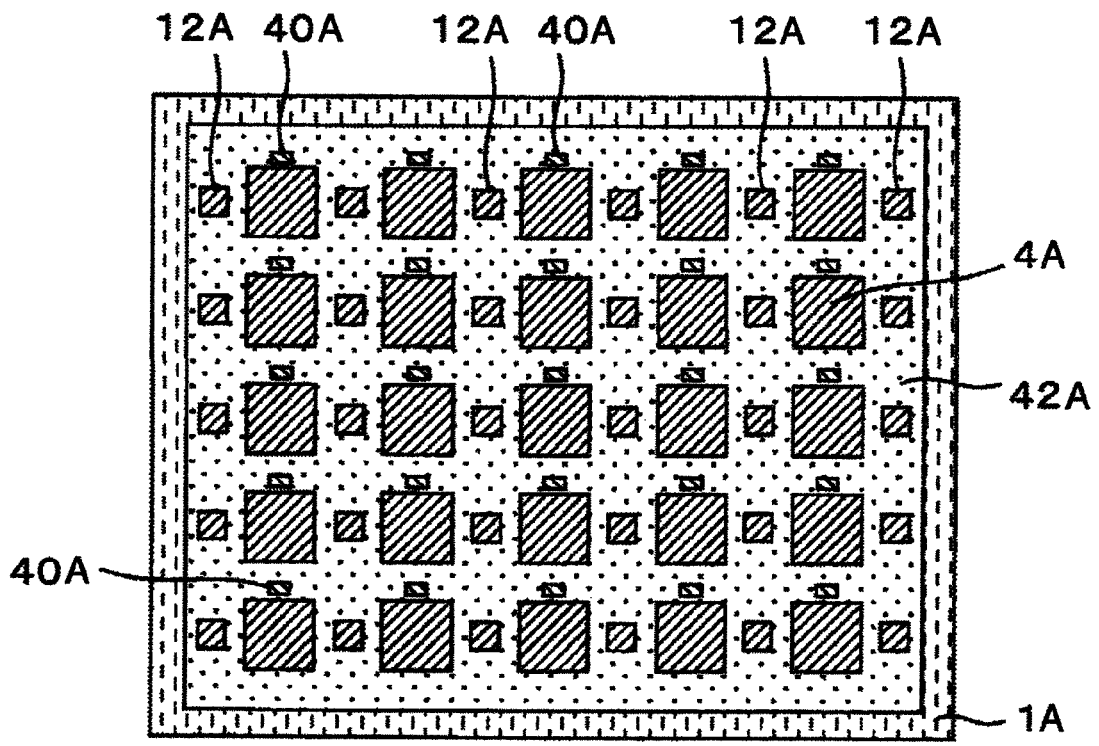
FIG. 14A is a plan view illustrating the device illustrated in FIG. 13A.
Figure 15A:
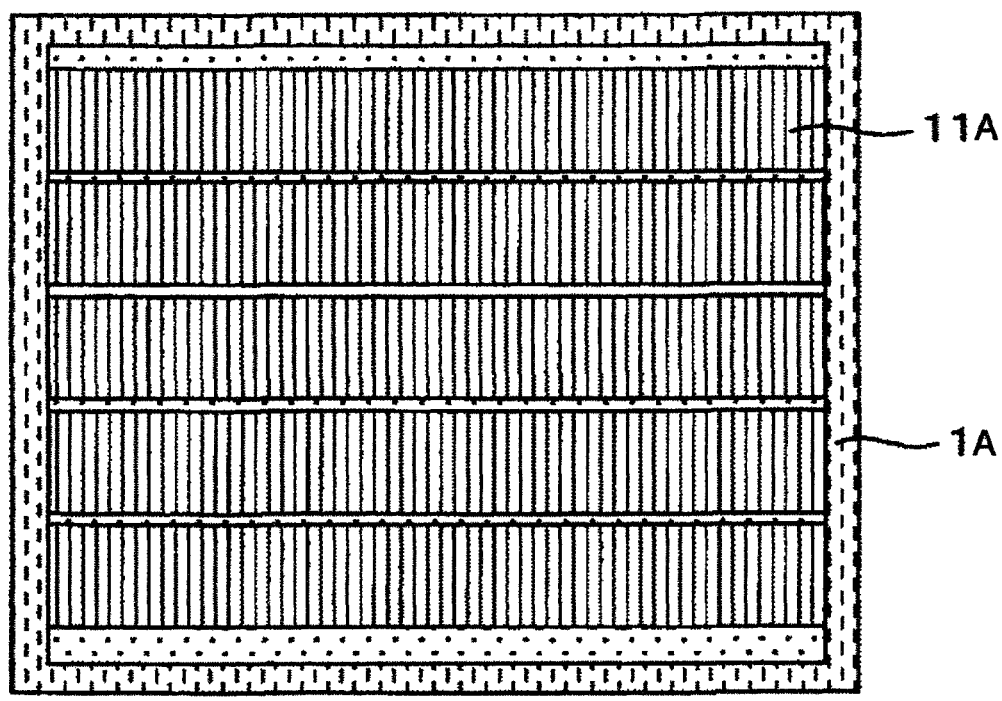
FIG. 15A is a plan view illustrating the device illustrated in FIG. 13A.

The organic light-emitting device manufactured in Example 6A is described. FIG. 13A presents a cross-sectional view illustrating the organic light-emitting device manufactured in Example 6A, and FIGS. 14A and 15A present plan views illustrating the device illustrated in FIG. 13A, wherein the component playing the same role as that of the component described above is marked with the same numeral, and description of that component is partly omitted. The light-emitting device manufactured in Example 6A is characterized by the pixels arranged in a matrix pattern.

A metallic substrate 2A supports a first interlayer insulating film 3A, lower reflective electrode 4A, connection electrode 5A, second interlayer insulating film 6A, hole transporting layer 7A, white-color-emitting layer 8A, electron transporting layer 9A and electron injection layer 10A on one side, and is coated with an insulating film 1A on the other side, in a manner similar to that for Example 4A.

Next, an upper transparent electrode 11A is disposed on the electron transporting layer 10A, to cover the lower reflective electrode 4A and contact holes 12A and 40A, as illustrated in FIG. 15A.

Example 6A electrically connects the upper transparent electrode 11A and metallic substrate 2A to each other, to reduce wiring resistance in the upper transparent electrode 11A, thereby reducing power consumption caused by wiring resistance. Moreover, temperature rise caused by wiring resistance is reduced to suppress deteriorated service life of the organic light-emitting element.

Example 5A disposes the upper transparent electrodes 11A in a stripe pattern, allowing the pixels, in which the upper transparent electrode 11A intersects with the lower reflective electrode 4A, to individually emit light. Therefore, the organic light-emitting device manufactured in Example 6, when used as a light source for a known liquid-crystalline display device, can emit light pixel by pixel, thereby reducing power consumption and improving contrast.

Example 7A

Figure 16A:
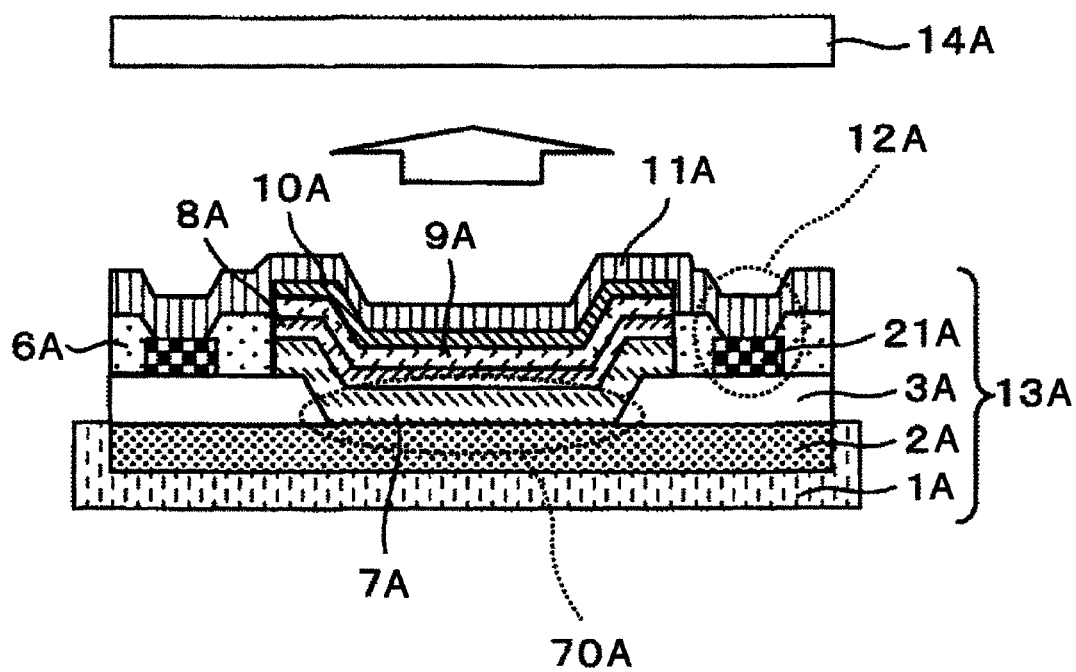
FIG. 16A is a cross-sectional view illustrating an organic light-emitting device, manufactured in Example 7A.
Figure 17A:
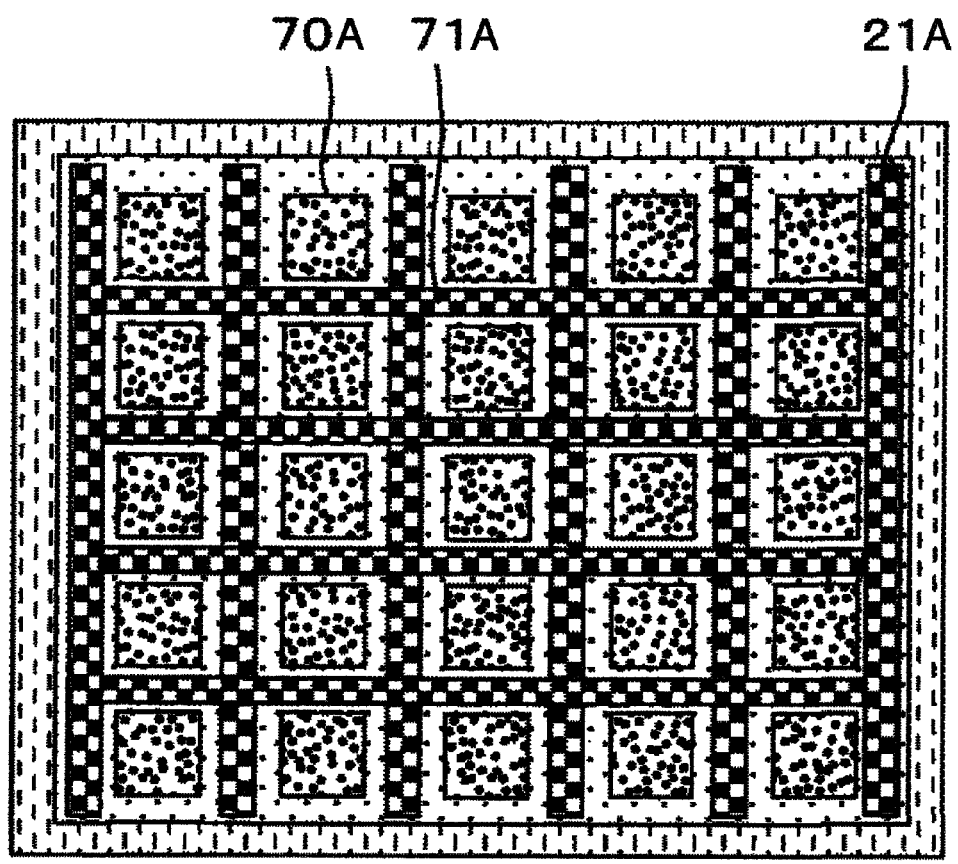
FIG. 17A is a plan view illustrating the device illustrated in FIG. 16A.
Figure 18A:
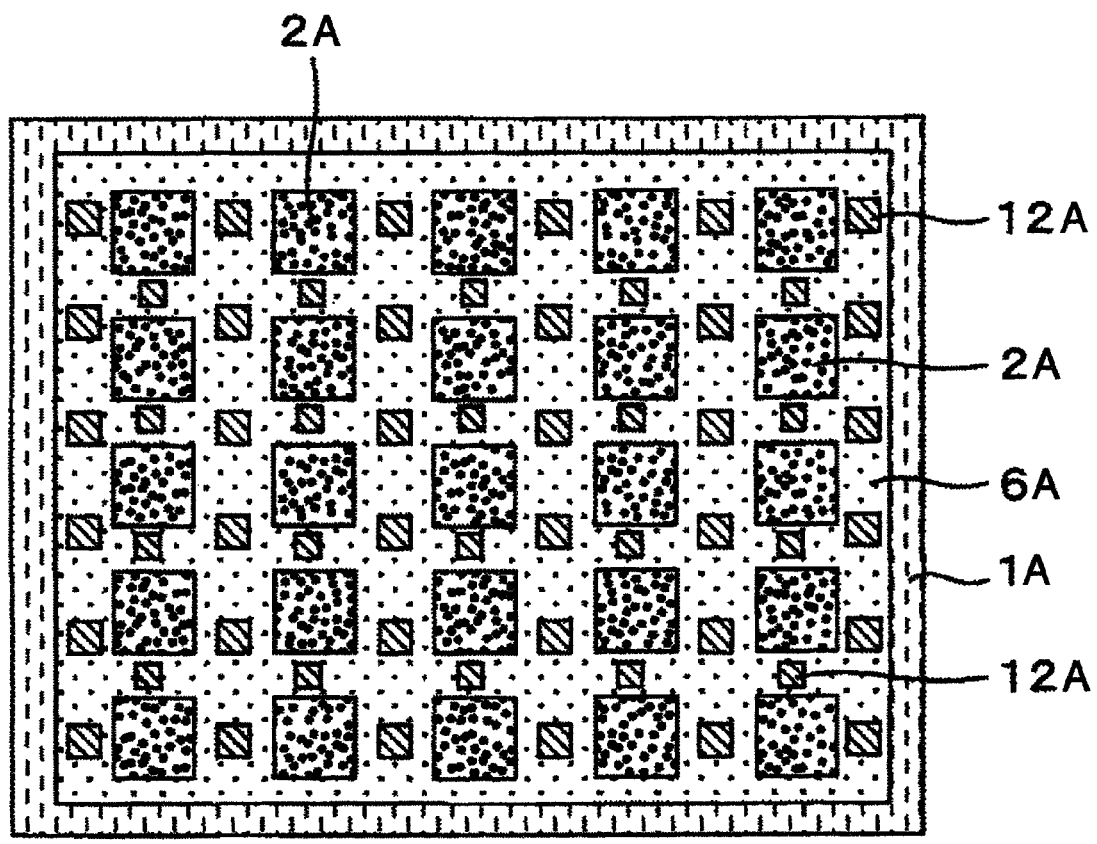
FIG. 18A is a plan view illustrating the device illustrated in FIG. 16A.

The organic light-emitting device manufactured in Example 7A is described. FIG. 16A presents a cross-sectional view illustrating the organic light-emitting device manufactured in Example 7A, and FIGS. 17A and 18A present plan views illustrating the device illustrated in FIG. 16A, wherein the component playing the same role as that of the component described above is marked with the same numeral, and description of that component is partly omitted. Example 7A uses a metallic substrate 2A as a reflective electrode (lower reflective electrode in the light-emitting element) capable of reflecting emitted light to simplify the layered structure, and disposes auxiliary interconnectors for an upper transparent electrode 11A in a mesh pattern to reduce wiring resistance.

A metallic substrate 2A supports a first interlayer insulating film 3A and contact holes 70A disposed in a point-like pattern on one side, and is coated with an insulating film 1A on the other side, in a manner similar to that for Example 2A.

Next, auxiliary interconnectors 21A and 71A are disposed on the first interlayer insulating film 3A to surround the contact holes 70A. Example 7A uses the same material for the interconnectors 21A and 71A. However, they may be made of materials different from each other. A second interlayer insulating film 6A and contact holes 12A are disposed on the first interlayer insulating film 3A in a manner similar to that for Example 2A.

Next, a hole transporting layer 7A, white-color-emitting layer 8A, electron transporting layer 9A, electron injection layer 10A and upper transparent electrode 11A are disposed in a manner similar to that for Example 2A.

Next, the OLED substrate 13A and sealing substrate 14A are sealed in a manner similar to that for Example 2A.

Example 7A electrically connects the upper transparent electrode 11A to the auxiliary interconnectors 21A and 71A, which are disposed in a mesh pattern, to reduce wiring resistance in the upper transparent electrode 11A, thereby reducing power consumption caused by wiring resistance. Moreover, temperature rise caused by wiring resistance is reduced to suppress deteriorated service life of the organic light-emitting element.

Example 7A uses the metallic substrate 2A as the lower reflective electrode capable of reflecting emitted light, thereby simplifying the layered structure, and decreasing the manufacturing process steps and the production cost.

Example 1B

Examples (Examples 1B to 7B) for the third embodiment of the present invention are described by referring to FIGS. 1B, 2B, 5B and 6B.

Figure 5B:
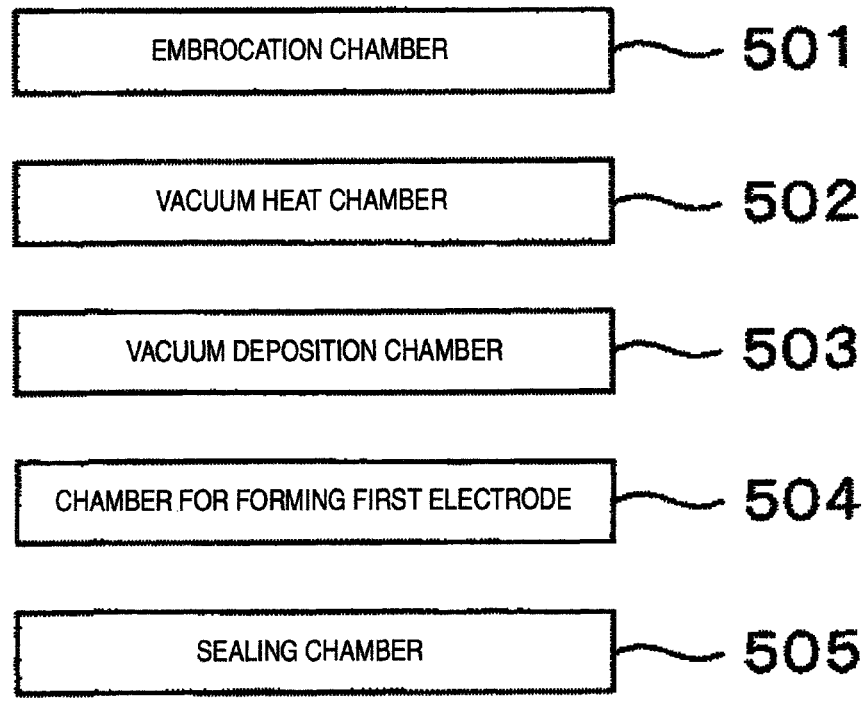
FIG. 5B is a process chart for manufacturing an organic light light-emitting element by the third embodiment of the present invention.

FIG. 1B illustrates process steps for manufacturing an organic light-emitting element, wherein each of (A), (B), (C), (D) and (E) presents a cross-sectional view of an organic light-emitting element structure manufactured in each process step. FIG. 2B outlines the organic light-emitting element structure which emits light from the substrate side. FIG. 5B presents a process flow chart for Example 1B, and FIG. 6B outlines the apparatus structure for manufacturing the organic light-emitting element in Example 1B.

The structure of organic light-emitting element manufactured in Example 1B is described by referring to FIG. 2B.

The organic light-emitting element illustrated in FIG. 2B has a laminated structure with a second electrode 205, hole transporting layer 204, light-emitting layer 203, electron transporting layer 202 and first electrode 201, disposed in this order. It is of bottom emission type in which light emitted from the light-emitting layer 203 is emitted from the second electrode 205 side, wherein the second electrode 205 and first electrode 201 serve as the respective anode and cathode.

The second electrode 205 is made of indium tin oxide (ITO), and can be patterned by photolithography. The anode material for the second electrode 205 is not limited to ITO, and any material may be used so long as it has transparency and high work function, e.g., indium zinc oxide (IZO) and other electroconductive oxides, and metals of high work function (e.g., thin Ag).

The hole transporting layer 204 is composed of a layer of hole injection material and/or layer of hole transporting material. The hole injection layer is made of poly(3,4-ethylene dioxythiophene) (PEDOT): polystyrene sulfonate (PSS). These materials are not limited for the hole injection layer. Other materials useful for the layer include polypyrrole-base and tirphenylamine-base polymers. Moreover, they may be combined with a low-molecular-weight compound, and phthalocyanine-base and starburst-amine-base compounds may be also used. The above layer may be combined with a layer capable of transferring holes and blocking electrons.

The PEDOT:PSS layer is formed by embrocation, and baked at 200° C. for 15 minutes. The hole transporting material layer is disposed between the PEDOT:PSS layer and light-emitting layer. It is photo-curable with light having a wavelength longer than that of near-ultraviolet ray. The hole transporting material is composed of a polymer, cross-linking agent and photo-polymerization initiator. The useful polymers include arylamine-base, polyfluorene-base, polyparaphenylene-base, polyarylene-base and polycarbazole-base ones. The useful cross-linking agents include oxetane-base, epoxy-base, vinyl-ether-base compounds. Example 1B uses an arylamine-base polymer as the polymer, oxetane-base compound as the cross-linking agent and triallylsulfonium salt as onium salt as the photo-polymerization initiator.

The hole transporting material layer is formed by ink jetting with a solution containing the above compounds. It can be formed between the hole injection material layer and light-emitting layer, because a bank is surface-treated to be water-repellent. The hole transporting material layer is insolubilized by photo-polymerization, when irradiated with light having a wavelength longer than that of near-ultraviolet ray. The photo-polymerization may be carried out in air.

The hole transporting material is not limited to the photo-curable material described above. The useful photo-polymerization initiators include those generate active radicals or acids, when irradiated with light. Those generate active radicals include acetophenone-base, benzoin-base, benzophenone-base, thioxanthone-base and triazine-base initiators.

The hole transporting material for the present invention may be incorporated with a thermal polymerization initiator. The initiators may be selected from those known as radical polymerization initiators, including azo compounds, e.g., 2,2'-azobisbutyronitrile, 2,2-azobis-(2,4-dimethylvaleronitrile), 2,2'-azobis-(4-methoxy-2,4-dimethylvaleronitrile); organic peroxides, e.g., benzoyl peroxide, lauroly peroxide, butylperoxypivalate and 1,1'-bis-(t-butylperoxy)cyclohexane; and hydrogen peroxide.

The materials useful for the light-emitting layer 203 include polyfluorene-base, polyparaphenylene-base, polyarylene-base and polycarbazole-base polymers, and so-called dendrimer type materials having light-emitting and charge transfer functions. So-called low-molecular-weight compounds may be also used. In such cases, the host material is preferably a carbazole or fluorene derivative. The dopant may be of Ir or Pt complex, and is dispersed in the light-emitting polymer. Example 1B uses a polyfluorene-base polymer for the light-emitting layer 203. The light-emitting layer 203 can be selectively disposed on the hole transporting layer 204, when formed by ink jetting with a solution, because the bank is kept water-repellent.

The applicable wet processes include ink jetting, printing and spraying. The useful solvents include mixed polar solvents, e.g., those of aromatic-base and alcohol-base solvents. It is needless to say that aromatic-base and alcohol-base solvents can be used individually. The solution (ink) preferably has a viscosity of 1 to 20 mPa·s at room temperature, when ink jetting is used. The solid concentration in the solution is not limited, so long as the solution gives a desired layer thickness.

The electron transporting 202 works to provide electrons to the light-emitting layer 203. Example 1B forms the layer light-emitting layer 202 by vacuum deposition using bis(2-methyl-8-quinolinate)-4-(phenylphenolate) aluminum (BAlq). However, the compound for the layer 202 is not limited to BAlq. The other useful compounds include tris(8-quinolinolate)aluminum derivatives, oxadiazole derivatives, triaszole derivatives, fllerene derivatives, phenanthroline derivatives and quinoline derivatives.

Example 1B uses a laminate of LiF and Al for the first electrode 201. The materials useful for the electrode 201 are not limited to them. Examples of the other useful materials include electron transporting materials other than LiF (e.g., Cs, Ba and Ca compounds) co-deposited with an alkaline metal (e.g., Li or Cs), alkaline-earth metal or electron donating organic compound.

The method for manufacturing the organic light-emitting element of the present invention is described by referring to FIG. 1B.

Example 1B uses a first organic compound 105B for the hole transporting layer 204 and light-emitting layer 203, illustrated in FIG. 2B, and second organic compound 106B for the electron transporting layer 202, illustrated in FIG. 2B.

FIG. 1B (A) illustrates a process step for forming a second electrode 103B and diaphragm 104B.

A TFT-containing layer 102B is composed of an insulating film covering a substrate 101B, TFT, drain and source electrodes in the TFT, and insulating film for protecting the drain and source electrodes. After the TFT-containing layer 102B is formed, a second electrode 103B is formed, wherein the electrode 103B is electrically connected to the drain electrode or source electrode in the TFT-containing layer 102B. Then, the diaphragm 104B is formed to cover the second electrode 103B edges.

The material for the diaphragm 104B is not limited. The useful materials include various resins, e.g., polyimide and acrylic resins. Example 1B uses a photo-sensitive polyimide resin. The diaphragm 104B may be formed by embrocation, and lithographic exposure and development with a given photo-mask. The bank is surface-treated to be water-repellent. For example, the surface is fluorinated with plasma of fluorine-base gas.

The diaphragm 104B may contain carbon to take on black color to absorb more heat in the subsequent step of heating under a vacuum. The black-color source is not limited to carbon, so long as the diaphragm 104 takes on black color.

FIG. 1B (B) illustrates a process step for forming the first organic compound 105B containing the light-emitting layer. The first organic compound 105B formed in Example 1B is used for the hole transporting layer 204 and light-emitting layer 203. The compound 105B is formed on the second electrode 103B by embrocation.

FIG. 1B (C) illustrates a step of heating under a vacuum ($10^{-4}$ Pa or less) to remove moisture from the first organic compound 105B. The devices for securing the above degree of vacuum include, but not limited to, cryo-pump, turbo molecular pump and ion pump. Any type of pump may be used so long as it can secure the above degree of vacuum. Example 1B uses a planar heat generator (so-called hot plate type heat generator) as the heating apparatus 108B for the vacuum heating step. The heating apparatus 108B is disposed on the substrate 101B side to be in contact with the substrate 101B.

The degree of vacuum is preferably as close to 0 Pa as possible. However, it is preferably $10^{-7}$ Pa or more in consideration of the commercialized techniques.

The heating apparatus 108B heats the substrate 101B, and the first organic compound 105B to 70 to 100° C. Moisture is removed from the first organic compound 105B which is heated by the heating apparatus 108B in a vacuum chamber kept at $10^{-4}$ Pa.

Test results indicate that heating at 70° C. under a vacuum is more effective for prolonging service life of the element than at 50° C. Removal of moisture is observed at 80° C. and substantially completed at 100° C., as revealed by TDS analysis. It is considered that moisture is removed from the first organic compound 105B when it is heated at 70 to 100° C. under a vacuum. The upper temperature limit is set at 100° C., because the film may be deteriorated at a higher temperature, depending on organic compound that constitutes the film.

FIG. 1B (D) illustrates a step for forming a layer containing the second organic compound 106B.

The second organic compound 106B formed in Example 1B is the electron transporting layer 202, illustrated in FIG. 2.

The layer containing the second organic compound 106B is formed on the layer containing the first organic compound 105B, thermally treated under a vacuum to remove moisture, by vacuum deposition. The degree of vacuum is kept at $10^{-4}$ Pa or less also in this step. The devices for securing the above degree of vacuum include, but not limited to, cryo-pump, turbo molecular pump and ion pump. Any type of pump may be used so long as it can secure the above degree of vacuum.

FIG. 1B (E) illustrates a step for forming a first electrode 107B.

The first electrode 107B is formed on the layer containing the second organic compound 106B under a vacuum of $10^{-4}$ Pa or less. The devices for securing the above degree of vacuum include, but not limited to, cryo-pump, turbo molecular pump and ion pump. Any type of pump may be used so long as it can secure the above degree of vacuum.

Degree of vacuum is kept at $10^{-4}$ Pa or less from the heating step, illustrated in FIG. 1B (C), to the first electrode forming step, illustrated in FIG. 1B (E). A transfer step is provided from one step to the subsequent one. Degree of vacuum is kept at $10^{-4}$ Pa or less also in the transfer step.

The devices for securing the above degree of vacuum include, but not limited to, cryo-pump, turbo molecular pump and ion pump. Any type of pump may be used so long as it can secure the above degree of vacuum.

Figure 6B:
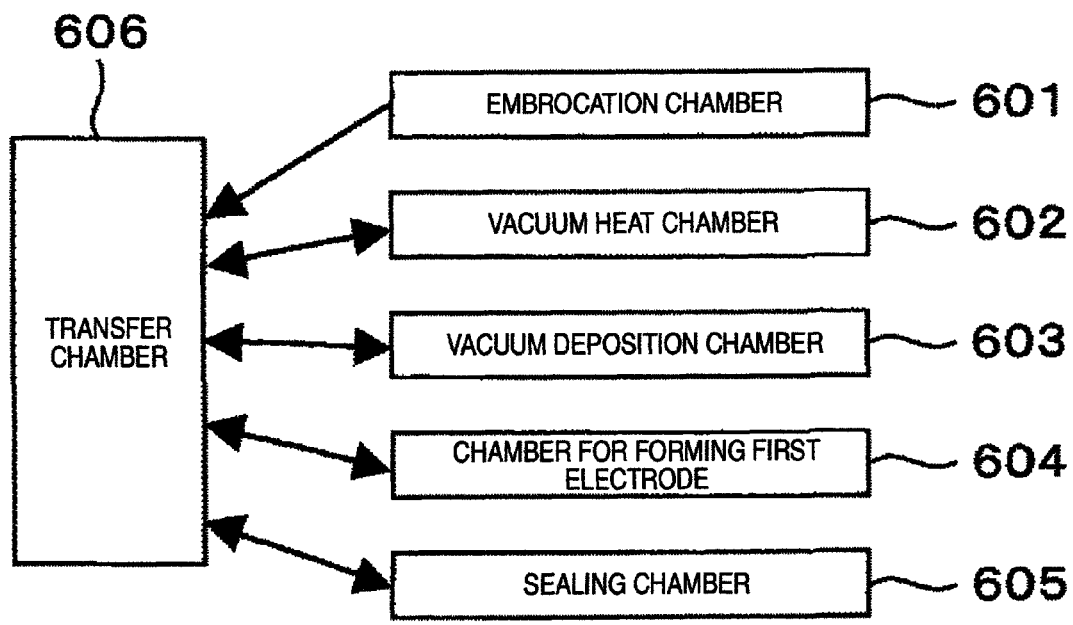
FIG. 6B outlines the apparatus structure of the third embodiment of the present invention for manufacturing an organic light-emitting element.

FIG. 5B presents a flow chart of the process steps used in Example 1B. The substrate 101B is transferred from an embrocation chamber 501 for forming the first organic compound 105B to a vacuum chamber 502 for heating the first organic compound 105B under a vacuum, vacuum deposition chamber 503 for forming the second organic compound 106B by vacuum deposition, chamber 504 for forming the first electrode 107B and sealing chamber 505 for keeping the manufactured organic light-emitting element unexposed to the atmosphere, in this order. The first electrode 107B is formed by resistance heating or sputtering in the chamber 504. FIG. 6B outlines the apparatus structure for manufacturing the organic light-emitting element in Example 1B. It comprises an embrocation chamber 601, vacuum chamber 602 for heating under a vacuum, vacuum deposition chamber 603, chamber 604 for forming the first electrode, sealing chamber 605 and transfer chamber 606. Each chamber forms a closed space by a door, and is completely independent from the others.

The substrate 101B is coated with the first organic compound 105B in the embrocation chamber 601 by an embrocation method, and is transferred to the transfer chamber 606 in an inert atmosphere having a dew point of −90° C. or higher (corresponding to a moisture content of about 100 ppb or less) of the embrocation chamber 601 and the transfer chamber 606 in the one-way direction to prevent a back flow of from the transfer chamber 606 to the embrocation chamber 601. The doors in the chambers 601 and 606 are closed after the coated substrate 101B is transferred into the chamber 606. The chamber 606 is kept at a vacuum of $10^{-4}$ Pa or less by a vacuum pump (e.g., cryo-pump, turbo molecular pump, ion pump or the like). Any type of pump may be used so long as it can secure the above degree of vacuum. Then, the coated substrate 101B is transferred from the transfer chamber 606 to the vacuum heat chamber 602, where it is heated under a vacuum of $10^{-4}$ Pa or less in the vacuum heat chamber 602. The vacuum heat chamber 602 is equipped with a planar heat generator (so-called hot plate type heating apparatus). The planar heat generator has a wider area than the substrate 101B, to uniformly heat the substrate 101B at from 70° C. to 100° C., preferably at 100° C.

The coated substrate 101B is heated at 100° C. for 30 minutes, and then cooled for 30 minutes.

The chamber 602 is kept at a vacuum of $10^{-4}$ Pa or less by a vacuum pump, e.g., cryo-pump, turbo molecular pump, ion pump or the like.

The coated substrate 101B treated in the chamber 602 is transferred back to the chamber 606, which is kept at a vacuum of $10^{-4}$ Pa or less. It is then transferred from the chamber 606 to the chamber 603, where it is coated with the second organic compound 106 by vacuum deposition. It is then transferred back to the chamber 606, and from the chamber 606 to the chamber 604, where it is coated with the first electrode 107B to have the organic light-emitting element. The element is transferred back to the chamber 606, and then to the chamber 605, where it is kept unexposed to the atmosphere.

The apparatus used in Example 1B for manufacturing the organic light-emitting element has a structure of so-called cluster type. It transfers the coated substrate 101B to each of the chambers via a single transfer chamber. The transfer chamber 606 is equipped with an arm for supporting the coated substrate 101B. The apparatus structure including the transfer chamber 606 is not limited to the one illustrated in FIG. 6B which only outlines the structure. The chamber 606 has doors each opening for transferring the coated substrate 101B to a specific chamber and bringing it back from that chamber. It closes the door after receiving the coated substrate 101B. The coated substrate 101B is then rotated and moved, and transferred to the subsequent chamber.

The apparatus may have the two or more transfer chambers 606 for various reasons, e.g., locations of the chambers 601, 602, 603, 604 and 605, distance between the adjacent chambers and layout of the chambers. Even in such a case, each of the transfer chambers 606 must be kept at $10^{-4}$ Pa or less.

The method and apparatus of Example 1B can conveniently manufacture the light-emitting layer by embrocation, and organic light-emitting element of prolonged service life.

The method and apparatus of Example 1B can remove moisture from the light-emitting layer to manufacture the organic light-emitting element of prolonged service life. The organic light-emitting element manufactured by the present invention described in Example 1B can find wide applicable areas, e.g., active-matrix or passive-matrix organic light-emitting display devices, back lights for LCD panels, and various illuminators.

Example 2B

Example 2B is described by referring to FIGS. 1B, 3B, 5B and 6B.

Figure 3B:
FIG. 3B is a cross-sectional view illustrating the organic light-emitting element manufactured by the third embodiment of the present invention, emitting light from a first electrode.

FIG. 3B outlines the organic light-emitting element structure manufactured in Example 2B. The element manufactured in Example 2B differs from that manufactured in Example 1B in that a second electrode 305 and first electrode 301 illustrated in FIG. 3B serve as the respective reflective electrode and transparent electrode.

The organic light-emitting element illustrated in FIG. 3B has a laminated structure with a second electrode 305, hole transporting layer 304, light-emitting layer 303, electron transporting layer 302 and first electrode 301, disposed in this order. It is of top emission type in which light emitted from the light-emitting layer 303 is emitted from the first electrode 301 side, wherein the second electrode 305 and first electrode 301 serve as the respective anode and cathode. The light-emitting element is manufactured in a manner similar to that for Example 1B, by the method illustrated in FIG. 1B, process flow illustrated in FIG. 5B and apparatus illustrated in FIG. 6B. The hole transporting layer 304 and light-emitting layer 303 are of the first organic compound 105B, and the electron transporting layer 302 is of the second organic compound 106B. The hole transporting layer 304 and light-emitting layer 303 are manufactured by embrocation, and the electron transporting layer 302 by vacuum deposition.

The second electrode 305 has a laminated structure with Al and ITO. Other materials useful for the second electrode 305 include Cr, Ag, Al and laminates of these metals with IZO. It is manufactured by treating the thin film of the above material(s) by photolithography or the like.

The first electrode 301 is made of In—Zn—O (IZO) film. The first electrode material is not limited to IZO, needless to say. Any material may be used so long as it is highly light-permeable. For example, it may be made of transparent ITO or ZnO, or Cr, Ag or the like formed into a thin film. The first electrode 301 is manufactured by resistance heating or sputtering.

The substrate 101B, after being coated with the light-emitting layer 303, is transferred from the chamber 602 eventually to the chamber 604 illustrated in FIG. 6, all of the chambers being kept at $10^{-4}$ Pa or less.

The organic light-emitting element is manufactured in Example 2B following the process flow chart illustrated in FIG. 5B and by the apparatus illustrated in FIG. 6B, in which the coated substrate 101B is transferred from one chamber to the subsequent one, both of these figures being described in Example 1B.

The method and apparatus used in Example 2B can conveniently manufacture the light-emitting layer by embrocation, and organic light-emitting element of prolonged service life, the element being of so-called top emission type. A top-emission type element gives an organic light-emitting display device of higher aperture ratio. Therefore, it can operate at a lower brightness, which leads to a longer service life.

The method and apparatus used in Example 2B can remove moisture from the light-emitting layer to manufacture the organic light-emitting element of prolonged service life. The organic light-emitting element manufactured in Example 2B can find wide applicable areas, e.g., actively or passively driven organic light-emitting display devices, back lights for liquid-crystalline panels, and various illuminators.

Example 3B

Example 3B is described by referring to FIGS. 1B, 4B, 5B and 6B.

Figure 4B:
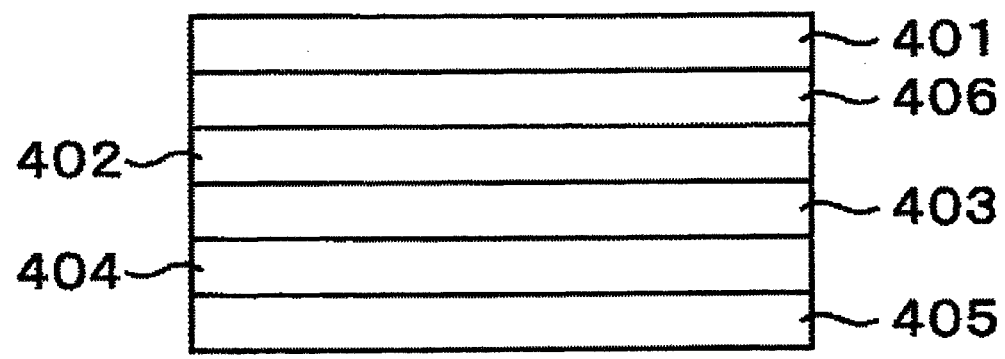
FIG. 4B is a cross-sectional view illustrating the organic light-emitting element manufactured by the third embodiment of the present invention, emitting light from a first electrode.

FIG. 4B outlines the organic light-emitting element structure manufactured in Example 3B. The element manufactured in Example 3B differs from that manufactured in Example 2B in that it has a different organic compound disposed between a second electrode 405 and first electrode 401. The element manufactured in Example 3B has a laminated structure with a second electrode 405, electron transporting layer 404, light-emitting layer 403, hole transporting layer 402, hole injection layer 406 and first electrode 401. It is of top emission type in which light emitted from the light-emitting layer 403 is emitted from the first electrode 401 side, wherein the second electrode 405 is reflective and first electrode 401 is transparent. The hole injection layer 406, manufactured by vacuum deposition, is made of a metallic oxide capable of efficiently injecting holes transferred from the first, transparent electrode 401. The metallic oxide is selected from those of molybdenum, ruthenium, aluminum, bismuth, gallium, germanium, magnesium, antimony, silicon, titanium, tungsten, yttrium, zirconium, iridium, rhenium and vanadium, having a work function of 5.5 eV or more.

The second electrode 405 is made of an AlNi alloy. The material useful for the electrode is not limited to the alloy. Other materials useful for the second electrode 405 include Al, AlNd alloy, AlSi alloy and Al/ITO laminate. It is manufactured by treating the thin film of the above material(s) by photolithography or the like.

The electron transporting layer 404 and light-emitting layer 403 are of the first organic compound 105B, and the hole transporting layer 402 and hole injection layer 406 are of the second organic compound 106B. The electron transporting layer 404 and light-emitting layer 403 are manufactured by embrocation, and the hole transporting layer 402 and hole injection layer 406 by vacuum deposition.

The first electrode 401 is made of In—Zn—O (IZO) film. The first electrode material is not limited to IZO. Any material may be used so long as it is highly light-permeable. For example, it may be made of transparent ITO or ZnO, or Cr, Ag or the like formed into a thin film. The first electrode 301 is manufactured by resistance heating or sputtering. The substrate 101B, after being coated with the light-emitting layer 403, is transferred from the chamber 606 eventually to chamber 604 illustrated in FIG. 6B, all of the chambers being kept at $10^{-4}$ Pa or less.

The organic light-emitting element is manufactured in Example 3B following the process flow chart illustrated in FIG. 5B and by the apparatus illustrated in FIG. 6B, in which the coated substrate 101B is transferred from one chamber to the subsequent one, both of these figures being described in Example 1B.

The method and apparatus used in Example 3B can conveniently manufacture the light-emitting layer by embrocation, and organic light-emitting element of prolonged service life, the element being of so-called top emission type. A top-emission type element gives an organic light-emitting display device of higher aperture ratio. Therefore, it can operate at a lower brightness, which leads to a longer service life. Moreover, Example 3B uses the metallic oxide capable of efficiently injecting holes transferred from the anode, thereby manufacturing the organic light-emitting element of high efficiency.

The method and apparatus used in Example 3B can remove moisture from the light-emitting layer to manufacture the organic light-emitting element of prolonged service life. The organic light-emitting element manufactured in Example 3B can find wide applicable areas, e.g., actively or passively driven organic light-emitting display devices, back lights for liquid-crystalline panels, and various illuminators.

Example 4B

Example 4B is described by referring to FIGS. 1B, 5B, 6B and 7B.

Figure 7B:
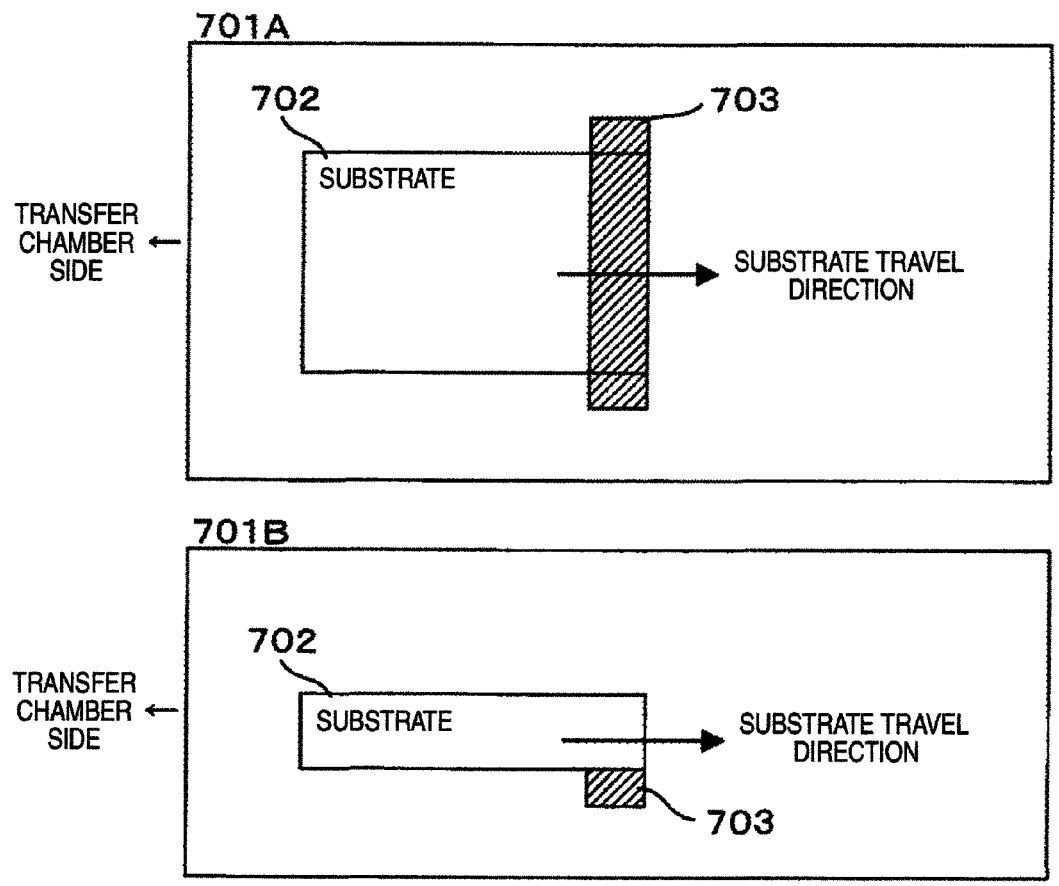
FIG. 7B outlines the vacuum chamber structure in the apparatus of the third embodiment of the present invention, provided with a high-frequency dielectric device.

Example 4B uses the same method and apparatus for manufacturing the organic light-emitting elements having the structure described in Examples 1B to 3B, except that a high-frequency dielectric device is disposed as the heating apparatus in the vacuum chamber 502 for heating the substrate under a vacuum. A vacuum chamber 701 used in Example 4B is illustrated in FIG. 7B which outlines a structure as one example of the process step illustrated in FIG. 1B (C), wherein 701A and 701B are respective plan and side views of the chamber. A substrate 702 contains the first organic compound 105 shown in FIG. 1B (C). The high-frequency dielectric device 703 is disposed below the substrate 702 (on the substrate 101B side in FIG. 1B), to heat the second electrode 103B in the substrate 702. The position of the device 703 is not limited to the one described above. The two or more devices 703 may be disposed on the first electrode 107B side, shown in FIG. 1 (E), to hold the substrate 101B in-between in the vertical direction. Moreover, the device 703 may be disposed to surround the substrate 702 to form a tunnel.

The high-frequency dielectric device 703 is at least as wide as the substrate 702 both in the substrate travel direction and the direction perpendicular to the travel direction. The substrate 702 travels in such a way to totally uniformly heat the second electrode 103B in the substrate 702. The substrate 702 travels to the right side, and the transfer chamber is positioned to the left side of the vacuum chamber in Example 4B, as shown in FIG. 7B.

The high-frequency dielectric device 703, which is disposed to heat the second electrode 103B, is not limited for its width in the longitudinal direction, so long as it uniformly heats the second electrode 103B in the substrate 101B.

The high-frequency dielectric device 703 used in Example 4B heats the second electrode 103B by the Joule heat generated by eddy current evolving in a conductor disposed in a high-frequency electromagnetic field, the heat being in proportion to the conductor surface skin resistance Rs. The Rs is given by the formula $Rs=\rho/\delta=(\omega\mu\rho/2)^{1/2}$, wherein $\omega$ is angular frequency, $\mu$ is permeability, $\rho$ is specific resistance and $\delta$ is the skin depth ($=(2\rho/\omega\mu)^{1/2}$).

Power P generated in the conductor is represented by the formula $P \propto Rs\int |I|^2 ds$, wherein I is current flowing in the conductor. The heat can be increased by increasing frequency $\omega$, and by using a material of high permeability $\mu$ and specific resistance $\rho$.

The high-frequency dielectric device 703 generates an electromagnetic wave having a frequency of about 60 to 90 kHz to heat the second electrode 103B. The second electrode 103B can be easily heated, because it is sufficiently thin (thickness: 100 to 300 nm) and has a high resistance. As illustrated in FIG. 7B, the substrate 702 is thoroughly heated uniformly while traveling in the chamber. The second electrode 103B is heated at 70 to 100° C., preferably at 100° C. Moisture can be removed in a short time from the first organic compound 105B containing the light-emitting layer by the heat from the second electrode 103B, which is disposed immediately below the compound 105B. Moreover, the cooling period can be shortened, because the substrate 702 is not totally heated.

The high-frequency dielectric device 703 is disposed at around the vacuum chamber 701 center in FIG. 7B. However, the position of the device 703 is not limited to the above. It may be located anywhere, so long as it can uniformly heat the substrate 702. For example, it may be located on the transfer chamber side in the chamber 701, or on the doorway side of the substrate 702 in the chamber 701 (left side in FIG. 7B). The substrate 702 is transferred from the transfer chamber 606 to the vacuum chamber 701 while these chambers are kept at $10^{-4}$ Pa or less. The second electrode 103B may be heated while the substrate 702 is transferred from the transfer chamber 606 to the vacuum chamber 701.

The high-frequency dielectric device 703 generates an electromagnetic wave having a frequency of about 60 to 90 kHz while overlapping the second electrode 103B in the substrate 702 to heat the second electrode 103B in a very short time, thereby removing moisture from the first organic compound 105B containing the light-emitting layer. The heating under a vacuum preferably lasts 1 minute or more for the structure manufactured in Example 4B.

Example 4B manufactures the organic light-emitting element following the process flow chart illustrated in FIG. 5B and by the apparatus illustrated in FIG. 6B for manufacturing the organic light-emitting elements in Examples 1B to 3B, in which the coated substrate 101B is transferred from one chamber to the subsequent one, both of these figures being described in Example 1B.

The method and apparatus used in Example 4B can conveniently manufacture the light-emitting layer by embrocation, and organic light-emitting element of prolonged service life.

The high-frequency dielectric device 703 used in Example 4B selectively heats the second electrode 103B while not heating the whole substrate 702, thereby shortening the heating time and cooling time, and hence improving productivity.

The method and apparatus used in Example 4B can remove moisture from the light-emitting layer to manufacture the organic light-emitting element of prolonged service life. The organic light-emitting element manufactured in Example 4B can find wide applicable areas, e.g., actively or passively driven organic light-emitting display devices, back lights for liquid-crystalline panels, and various illuminators.

Example 5B

Figure 8B:
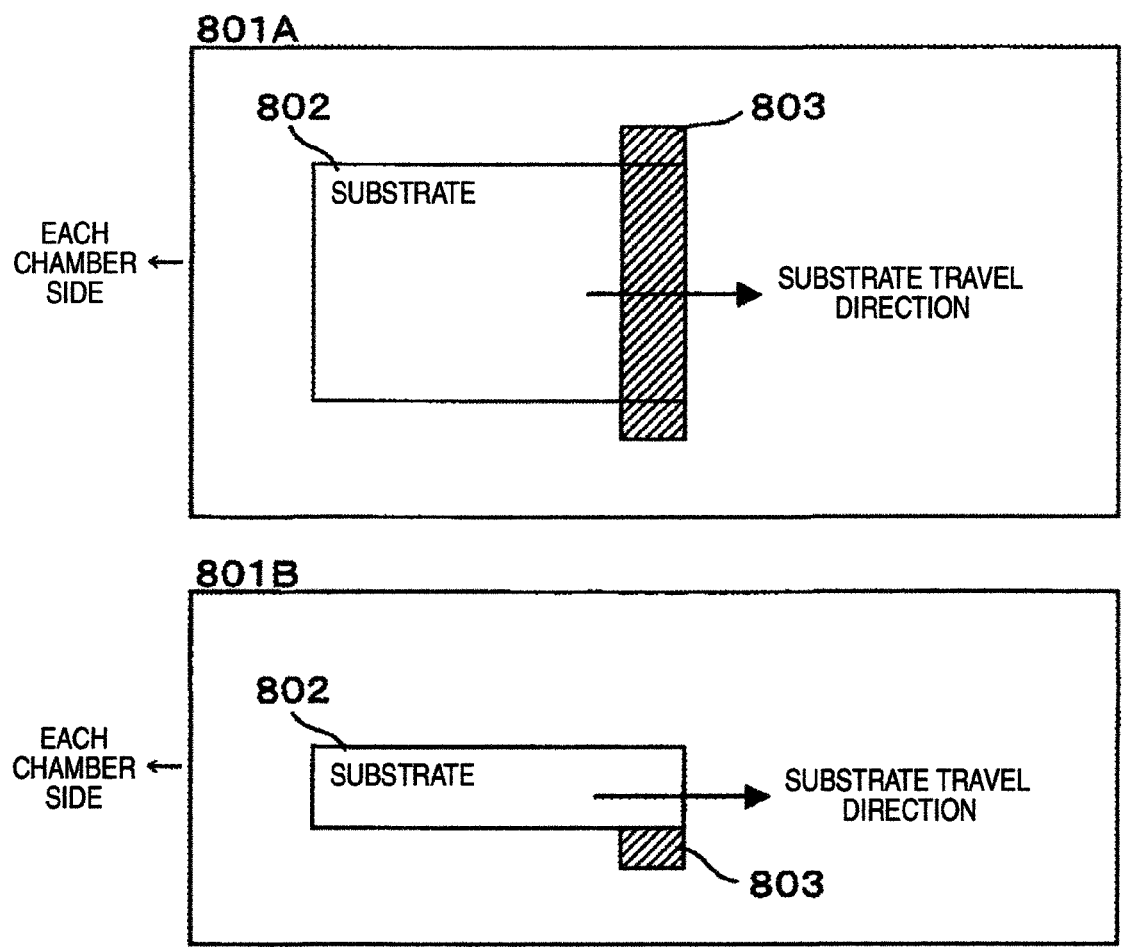
FIG. 8B outlines the transfer chamber structure in the apparatus of the third embodiment of the present invention, provided with a high-frequency dielectric device.
Figure 9B:
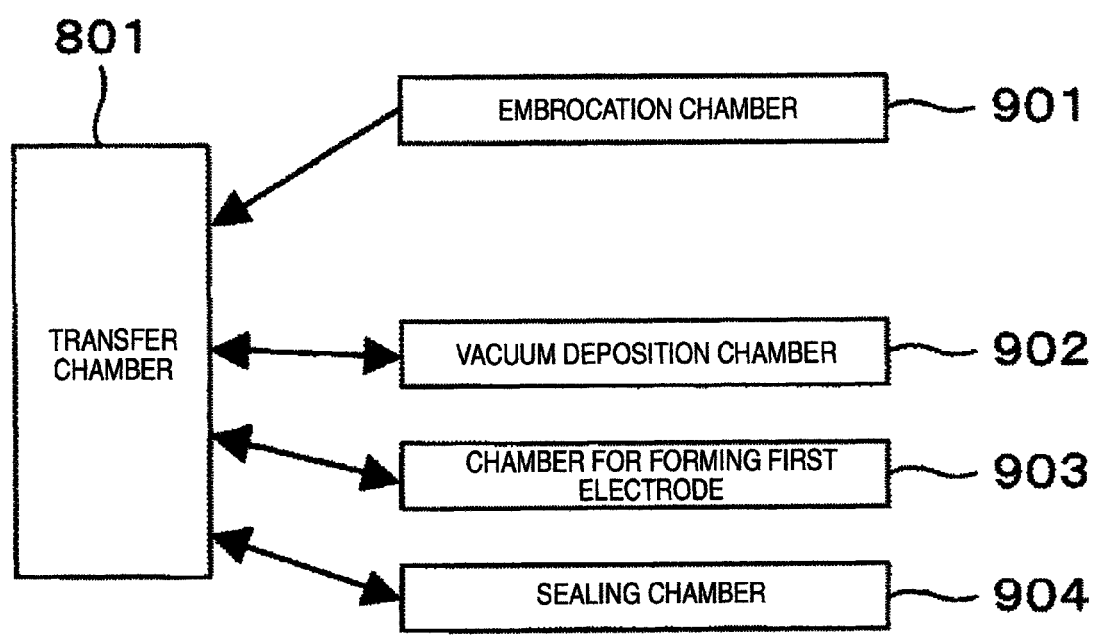
FIG. 9B outlines the apparatus structure of the third embodiment of the present invention for manufacturing an organic light-emitting element, provided with a high-frequency dielectric device.

Example 5B is described by referring to FIGS. 1B, 8B and 9B.

Example 5B uses the same method and apparatus described in Example 4B for manufacturing the organic light-emitting elements having the structure described in Examples 1B to 3B, except that a high-frequency dielectric device is disposed at a different location. FIG. 8B outlines the light-emitting element structure manufactured in Example 5B. FIG. 9B outlines an apparatus structure used in Example 5B for manufacturing an organic light-emitting element. In Examples 5B, a high-frequency dielectric device 803 is disposed in a transfer chamber 801. FIG. 8B outlines one example of the vacuum heating step of FIG. 1B(C). The transfer chambers 801A and 801B are respective plan and side views of the transfer chamber. A substrate 802 contains the first organic compound 105B illustrated in FIG. 1B (C). The substrate 802 is transferred from an embrocation chamber 901 to a vacuum deposition chamber 902 invariably via the transfer chamber 801, in which the high-frequency dielectric device 803 is disposed. The device 803 may be disposed on the side of doorway for transferring the substrate 802, as with the case in Example 4B. In FIG. 8B, the substrate 802 travels to the right side, and each chamber is disposed on the left side.

An apparatus structure used in Example 5B for manufacturing an organic light-emitting element is outlined by referring to FIG. 9B. The substrate 802 is transferred from the embrocation chamber 901 to the transfer chamber 801, where it is heated under a vacuum. The substrate 802 treated in the transfer chamber 801 is then transferred to the vacuum deposition chamber 902. The subsequent steps are the same as those used in Example 1B.

The method and apparatus used in Example 5B can conveniently manufacture the light-emitting layer by embrocation, and organic light-emitting element of prolonged service life.

The apparatus for manufacturing an organic light-emitting element, having the structure described in Example 5B, needs no chamber for heating the substrate under a vacuum, thereby saving the space. The apparatus described in Example 5B completes the heating and cooling steps in a shorter time than those described in Examples 1B to 3B. The organic light-emitting element manufactured in Example 5B can find wide applicable areas, e.g., actively or passively driven organic light-emitting display devices, back lights for liquid-crystalline panels, and various illuminators.

Example 6B

Figure 10B:
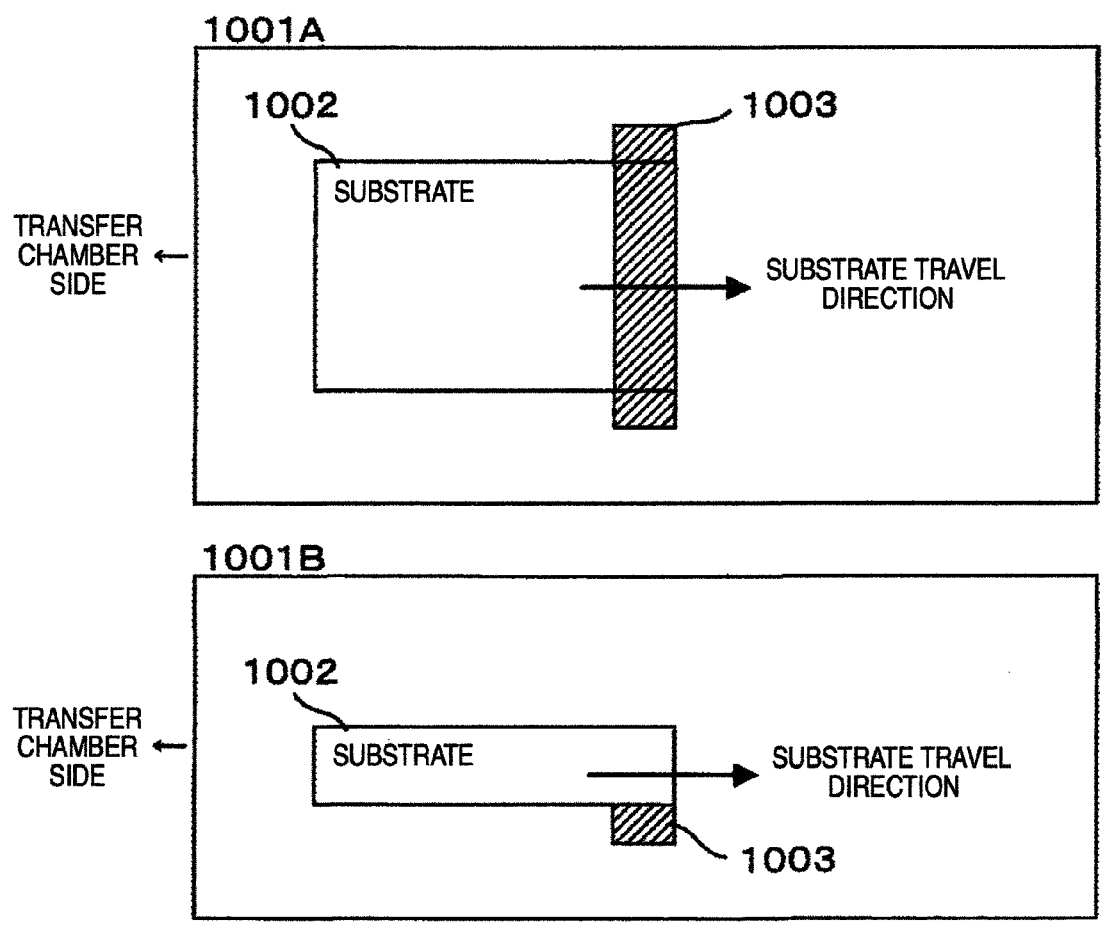
FIG. 10B outlines the vacuum chamber structure in the apparatus of the third embodiment of the present invention, provided with a high-frequency dielectric device.

Example 6B is described by referring to FIGS. 1B, 9B and 10B.

Example 6B uses the same method and apparatus described in Example 5B for manufacturing the organic light-emitting elements having the structure described in Examples 1B to 3B, except that a high-frequency dielectric device is disposed in another chamber. FIG. 10B outlines the vacuum deposition chamber 1001 structure, in which the high-frequency dielectric device 1003 is disposed. The device 1003 may be disposed in the chamber 1001 on the side of doorway for transferring a substrate 1002, as with the cases in Examples 4B and 5B, or at the interface between the transfer chamber 801 and vacuum deposition chamber 902. In FIG. 10B, the substrate 1002 travels to the right side, and the transfer chamber is disposed on the left side.

An apparatus structure used in Example 5B for manufacturing an organic light-emitting element is outlined by referring to FIG. 9B. The substrate 1002 is transferred from an embrocation chamber 901 to the transfer chamber 801, and then from the chamber 801 to the vacuum deposition chamber 902, where it is heated under a vacuum, as illustrated in FIG. 1B (C). The heated substrate 1002 is then coated with the second organic compound 106B in the chamber 902 by vacuum deposition, and transferred back to the transfer chamber 801. The subsequent steps are the same as those used in Example 1B.

The method and apparatus used in Example 6B can conveniently manufacture the light-emitting layer by embrocation, and organic light-emitting element of prolonged service life.

The apparatus having the structure described in Example 6B needs no chamber for heating the substrate under a vacuum, thereby saving the space. It can complete the heating and cooling steps in a shorter time than those described in Examples 1B to 3B. Moreover, it can remove moisture from the light-emitting layer to give an organic light-emitting element of prolonged service time.

The organic light-emitting element manufactured in Example 6B can find wide applicable areas, e.g., actively or passively driven organic light-emitting display devices, back lights for liquid-crystalline panels, and various illuminators.

Example 7B

The method and apparatus used in Example 7B are characterized in that the high-frequency dielectric device used in Examples 4B to 6B is replaced by a microwave generator for the chamber for heating a substrate under a vacuum. They are the same as those used in Examples 4B to 6B, except for the above. The microwave generator can heat the first organic compound 105 under a vacuum to remove moisture from the compound. It preferably outputs 0.1 to 1.5 kW for 1 minute or more.

The method and apparatus used in Example 7B can conveniently manufacture the light-emitting layer by embrocation, and organic light-emitting element of prolonged service life.

The apparatus described in Example 7B with the microwave generator can complete the heating and cooling steps in a shorter time, because the generator does not totally heat the substrate 101B, thereby improving productivity. Moreover, it can remove moisture from the light-emitting layer to give an organic light-emitting element of prolonged service time. The organic light-emitting element manufactured in Example 7B can find wide applicable areas, e.g., actively or passively driven organic light-emitting display devices, back lights for liquid-crystalline panels, and various illuminators.

In relation to the present invention, the following technical matters are disclosed.

(1) An organic light-emitting display device comprising:
 a light-emitting layer;
 an upper electrode and a lower electrode sandwiching the light-emitting layer, wherein one of the electrodes is a transparent electrode transmitting a light emitted from the light-emitting layer and the other electrode is a reflective electrode which reflects a light emitted from the light-emitting layer; and
 a moisture capturing layer disposed between the upper electrode and the lower electrode.

(2) The organic light-emitting display device according to (1), wherein the moisture capturing layer is disposed between the light-emitting layer and the upper electrode.

(3) The organic light-emitting display device according to (2), wherein a blocking layer and an electron transporting layer are disposed between the upper and lower electrodes, and the moisture capturing layer is disposed between the blocking layer and the electron transporting layer.

(4) The organic light-emitting display device according to (2), wherein the moisture capturing layer is disposed adjacently to the light-emitting layer, and the light-emitting layer is doped with a dopant at a lower concentration on a side adjacent to the moisture capturing layer than on the opposite side.

(5) The organic light-emitting display device according to (2), wherein the moisture capturing layer is disposed adjacently to the light-emitting layer, and the light-emitting layer has a light-emitting region separated from the moisture capturing layer.

(6) The organic light-emitting display device according to (2), wherein a blocking layer is disposed between the upper and lower electrodes, the moisture capturing layer is disposed between the light-emitting layer and the blocking layer, and the light-emitting layer contains an electron transporting material.

(7) The organic light-emitting display device according to (2), wherein a bank surface-treated to be water-repellent is disposed between the upper and lower electrodes.

(8) The organic light-emitting display device according to (2), wherein a light-emitting dopant dispersed in the light-emitting layer has an asymmetric structure.

(9) The organic light-emitting display device according to (2), wherein at least one of the materials, that constitute the light-emitting layer, has an asymmetric structure.

(10) The organic light-emitting display device according to (2), wherein the light-emitting layer contains a high-molecular-weight material.

(11) The organic light-emitting display device according to (2), wherein a thin, liquid-repellent film is disposed between adjacent pixels.

(12) The organic light-emitting display device according to (1), wherein the moisture capturing layer contains a metal and/or metal oxide.

(13) An organic light-emitting device comprising a light-emitting element disposed on an electroconductive substrate, the light-emitting element comprising a lower reflective electrode, an organic layer and an upper transparent electrode, wherein the upper transparent electrode is connected to the electroconductive substrate via a contact hole disposed around the lower reflective electrode.

(14) The organic light-emitting device according to (13), wherein the upper transparent electrode is connected to the electroconductive substrate via a connecting electrode made of a material similar to that for the lower reflective electrode.

(15) The organic light-emitting device according to (13), wherein an auxiliary interconnector is disposed to be connected to the lower reflective electrode.

(16) The organic light-emitting device according to (15), wherein the lower reflective electrode is arranged in a point-like pattern.

(17) The organic light-emitting device according to (16), wherein the upper transparent electrode is connected to the electroconductive substrate via a plurality of contact holes disposed around the lower reflective electrode arranged in a point-like pattern.

(18) The organic light-emitting device according to (14), wherein the upper transparent electrode has a stripe shape.

(19) An organic light-emitting device comprising a light-emitting element disposed on an electroconnductive substrate, the light-emitting element comprising an organic layer and an upper transparent electrode, wherein the electroconductive substrate serves as a reflective electrode capable of reflecting emitted light.

(20) The organic light-emitting device according to (19), wherein an auxiliary interconnector is disposed to be connected to the upper transparent electrode.

(21) The organic light-emitting device according to (20), wherein the auxiliary interconnector is arranged in a mesh pattern.

(22) A method for manufacturing an organic light-emitting element having:
a substrate;
a first electrode and a second electrode formed on the substrate; and
a first organic compound including a light-emitting layer and a second organic compound sandwiched between the first electrode and the second electrode, comprising the steps of:
forming the first organic compound;
heating the first organic compound under a vacuum; and
forming the second organic compound,
wherein the step of heating the first organic compound under a vacuum is carried out between the step of forming the first organic compound and the step of forming the second organic compound.

(23) The method according to (22), wherein the first organic compound is heated under a vacuum of from 0 to $1 \times 10^{-4}$ Pa.

(24) The method according to (22), wherein the first organic compound is heated at from 70° C. to 100° C.

(25) The method according to (22), wherein
the first organic compound is heated by a heat generator, and
the heat generator has a wider area than that of the substrate in the light-emitting element.

(26) The method according to (22), wherein the first electrode is a reflective electrode, and the second electrode is a transparent electrode.

(27) The method according to (22), wherein the first electrode is a transparent electrode, and the second electrode is a reflective electrode.

(28) The method according to (27), wherein the second organic compound includes a hole injection layer.

(29) An apparatus for manufacturing an organic light-emitting element having:
a substrate;
a first electrode and a second electrode formed on the substrate; and
a first organic compound including a light-emitting layer and a second organic compound sandwiched between the first electrode and the second electrode, which apparatus comprises:
an embrocation chamber for forming the first organic compound;
a vacuum heat chamber for heating the first organic compound under a vacuum;
a vacuum deposition chamber for forming the second organic compound;
a chamber for forming the first electrode by a resistance heating method or a sputtering method; and
a transfer chamber for transferring the substrate from the embrocation chamber to the vacuum heat chamber, from the vacuum heat chamber to the vacuum deposition chamber, and from the vacuum deposition chamber to the chamber for forming the first electrode.

(30) The apparatus according to (29), wherein the embrocation chamber, the vacuum heat chamber, the vacuum deposition chamber, the chamber for forming the first electrode and the transfer chamber are kept at from 0 to $1 \times 10^{-4}$ Pa.

(31) The apparatus according to (29), wherein a high-frequency dielectric device or a microwave generator is disposed in the vacuum heat chamber.

(32) The apparatus according to (31), wherein the substrate is heated while it is traveling, and the high-frequency dielectric device is at least as wide as the substrate both in a substrate travel direction and a direction perpendicular to the travel direction.

(33) An apparatus for manufacturing an organic light-emitting element having a first organic compound including a light-emitting layer and a second organic compound sandwiched between a first electrode and a second electrode, which apparatus comprises:
an embrocation chamber for forming the first organic compound;
a vacuum deposition chamber for forming the second organic compound;
a chamber for forming the first electrode by a resistance heating method or a sputtering method; and
a transfer chamber for transferring a substrate from the embrocation chamber to the vacuum deposition chamber, and from the vacuum deposition chamber to the chamber for forming the first electrode,
wherein a high-frequency dielectric device or a microwave generator is disposed in the transfer chamber.

(34) The apparatus according to (33), wherein the substrate is heated while it is traveling, and the high-frequency dielectric device is at least as wide as the substrate both in a substrate travel direction and a direction perpendicular to the travel direction.

(35) An apparatus for manufacturing an organic light-emitting element having:
a substrate;
a first electrode and a second electrode formed on the substrate; and
a first organic compound including a light-emitting layer and a second organic compound sandwiched between the first electrode and the second electrode, which apparatus comprises;

an embrocation chamber for forming the first organic compound;

a vacuum deposition chamber for forming the second organic compound;

a chamber for forming the first electrode by a resistance heating method or a sputtering method; and a transfer chamber for transferring the substrate from the embrocation chamber to the vacuum deposition chamber, and from the vacuum deposition chamber to the chamber for forming the first electrode, wherein a high-frequency dielectric device or a microwave generator is disposed in the vacuum deposition chamber.

(36) The apparatus according to (35), wherein the substrate is heated while it is traveling, and the high-frequency dielectric device is at least as wide as the substrate both in a substrate travel direction and a direction perpendicular to the travel direction.

INDUSTRIAL APPLICABILITY

The present invention conveniently manufactures an organic light-emitting display device, suitable for TV sets, various terminals and so on.

The present invention provides the method and apparatus which can conveniently manufacture the light-emitting layer by embrocation, and organic light-emitting element of prolonged service life. The element can find wide applicable areas, e.g., as display devices for TV sets, various terminals and so on, back lights for liquid-crystalline panels, and various illuminators.

What is claimed is:

1. An organic light-emitting device comprising a plurality of light-emitting elements disposed on an electroconductive substrate, each light-emitting element comprising a lower reflective electrode, an organic layer disposed on a first surface of the lower reflective electrode and an upper transparent electrode,
    wherein the upper transparent electrode is connected to the electroconductive substrate via a contact hole disposed around the lower reflective electrode,
    wherein a first auxiliary interconnector is disposed on a second surface of the lower reflective electrode opposite to the first surface, wherein the first auxiliary interconnector extends in a first direction, and
    wherein a second auxiliary interconnector is provided which connects the first auxiliary interconnector to another first auxiliary interconnector provided on an adjacent lower reflective electrode of an adjacent one of the light-emitting elements, wherein the second auxiliary interconnector extends in a second direction which is substantially perpendicular to said first direction.

2. The organic light-emitting device according to claim 1, wherein the upper transparent electrode is connected to the electroconductive substrate via a connecting electrode comprised of a material similar to the material comprising the lower reflective electrode.

3. The organic light-emitting device according to claim 2, wherein the upper transparent electrode has a stripe shape.

4. The organic light-emitting device according to claim 1, wherein the lower reflective electrodes are arranged in a point-like pattern.

5. The organic light-emitting device according to claim 4, wherein the upper transparent electrode is connected to the electroconductive substrate via a plurality of contact holes disposed around the lower reflective electrodes-arranged in a point-like pattern.

6. An organic light-emitting device comprising a plurality of-light emitting elements disposed on an electroconductive substrate, each light-emitting element comprising a lower reflective electrode, an organic layer disposed on a first surface of the lower reflective electrode, and an upper transparent electrode,
    wherein the electroconductive substrate serves as a reflective electrode capable of reflecting emitted light,
    wherein a first auxiliary interconnector is disposed on a second surface of the lower reflective electrode opposite to the first surface, wherein the first auxiliary interconnector extends in a first direction, and
    wherein a second auxiliary interconnector is provided which connects the first auxiliary interconnector to another first auxiliary interconnector provided on an adjacent lower reflective electrode of an adjacent one of the light-emitting elements, wherein the second auxiliary interconnector extends in a second direction which is substantially perpendicular to said first direction.

7. The organic light-emitting device according to claim 6, wherein an auxiliary interconnector is disposed to be connected to the upper transparent electrode.

* * * * *